(12) United States Patent
Kim et al.

(10) Patent No.: US 7,639,226 B2
(45) Date of Patent: Dec. 29, 2009

(54) LIQUID CRYSTAL DISPLAY PANEL WITH BUILT-IN DRIVING CIRCUIT

(75) Inventors: Binn Kim, Seoul (KR); Soo Young Yoon, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 883 days.

(21) Appl. No.: 11/139,663

(22) Filed: May 31, 2005

(65) Prior Publication Data

US 2006/0007085 A1    Jan. 12, 2006

(30) Foreign Application Priority Data

May 31, 2004  (KR) ........................ 10-2004-38888
Sep. 13, 2004  (KR) ........................ 10-2004-73106

(51) Int. Cl.
*G09G 3/36* (2006.01)
*G11C 19/00* (2006.01)

(52) U.S. Cl. ........................................ 345/100; 377/78
(58) Field of Classification Search ............. 377/64–81; 349/151; 345/87–102
See application file for complete search history.

(56) References Cited

U.S. PATENT DOCUMENTS

| | | | |
|---|---|---|---|
| 6,670,943 B1* | 12/2003 | Ishii et al. | 345/100 |
| 2003/0090614 A1* | 5/2003 | Kim et al. | 349/149 |
| 2005/0264507 A1* | 12/2005 | Jang et al. | 345/87 |

* cited by examiner

*Primary Examiner*—Bipin Shalwala
*Assistant Examiner*—Steven E Holton
(74) *Attorney, Agent, or Firm*—McKenna Long & Aldridge

(57) ABSTRACT

A liquid crystal display panel includes liquid crystal cells forming a matrix in a display area of the liquid crystal display panel; odd and even gate driving circuits provided at an outer area of the display area, the display area being positioned between the odd and even gate driving circuits, the odd driving circuit including a plurality of odd stages, the even driving circuit including a plurality of even stages; a plurality of gate lines, including even gate lines and odd gate lines in the liquid crystal cell matrix, the odd gate lines being driven by the odd driving circuit, and the even gate lines being driven by the even driving circuit, wherein a length of each of the odd stages and the even stages corresponds to size larger than a length of the liquid crystal cell.

24 Claims, 20 Drawing Sheets

LIQUID CRYSTAL DISPLAY PANEL WITH BUILT-IN DRIVING CIRCUIT

This application claims the benefit of Korean Patent Application Nos. 10-2004-38888 filed in Korea on May 31, 2004, and 10-2004-73106 filed in Korea on Sep. 13, 2004, both of which are hereby incorporated by reference in their entirety.

BACKGROUND OF THE INVENTION

1. Field of the Invention

This invention relates to a liquid crystal display, and more particularly to a liquid crystal display panel having a built-in driving circuit.

2. Description of the Related Art

Generally, a liquid crystal display (LCD) device can be used as a display monitor for a television and a computer. In an LCD device, light transmittance of a liquid crystal is controlled using an electric field to thereby display a picture. To this end, the LCD includes a liquid crystal display panel having liquid crystal cells arranged in a matrix type. A driving circuit is provided for driving the liquid crystal display panel.

FIG. 1 is a block circuit diagram showing a configuration of a related art liquid crystal display device. Referring to FIG. 1, a related art LCD device includes a liquid crystal display panel 13 having (m×n) liquid crystal cells Clc arranged in a matrix, m data lines D1 to Dm and n gate lines G1 to Gn crossing each other and thin film transistors TFT provided at crossing of the data lines and the gate lines, a data driving circuit 11 for applying a data to the data lines D1 to Dm of the liquid crystal display panel 13, and a gate driving circuit 12 for applying a scanning pulse to the gate lines G1 to Gn.

The liquid crystal display panel 13 is formed by joining a thin film transistor substrate to a color filter substrate. The thin film transistor substrate is provided with a thin film transistor array. The color filter substrate is provided with a color filter array. a liquid crystal layer is provided between the thin film transistor substrate and the color filter substrate. The color filter substrate is provided with a black matrix, a color filter and a common electrode. Polarizers having polarization axes perpendicular to each other are respectively attached onto the thin film transistor substrate and the color filter substrate of the liquid crystal display panel 13, and an alignment film for determining a free-tilt angle of the liquid crystal is further provided on the inner side surface coming in touch with the liquid crystal layer.

The data lines D1 to Dm and the gate lines G1 to Gn provided at the thin film transistor substrate of the liquid crystal display panel 13 cross each other perpendicularly. The thin film transistor TFT provided at each crossing of the data lines D1 to Dm and the gate lines G1 to Gn applies a data voltage supplied via the data lines D1 to Dn to a pixel electrode of the liquid crystal cell Clc in response to a scanning pulse from the gate line G1 to Gn. The liquid crystal cell Clc rotates a liquid crystal having a dielectric anisotropy in response to a potential difference between a data voltage supplied to the pixel electrode and a common voltage supplied to the common electrode to thereby control light transmittance. Further, each liquid crystal cell Clc is provided with a storage capacitor Cst. The storage capacitor Cst is provided between the pixel electrode and a pre-stage gate line or between the pixel electrode and a common line (not shown), thereby holding constant a data voltage charged in the liquid crystal cell Clc. The data driving circuit 11 converts an input digital video data into an analog data voltage using a gamma voltage. The data driving circuit 11 applies the converted analog data voltage to the data lines D1 to Dm. The gate driving circuit 12 sequentially applies a scanning pulse to the gate lines GL1 to GLn to thereby select a horizontal line of the liquid crystal cell Clc to be supplied with a data.

FIG. 2 is a block diagram showing a configuration of a gate driving circuit shown in FIG. 2 according to the related art. As shown in FIG. 2, the gate driving circuit 12 includes a shift register having an n-number of stages, 1st to nth, connected in a cascade to an input line of a start pulse Vst to sequentially supply a scanning pulse to gate lines G1 to Gn. The 1st to nth stages shown in FIG. 2 are commonly supplied with a clock signal CLK, along with high-level and low-level driving voltages VDD and VSS, and with a start pulse Vst or an output signal of the previous stage. The 1st stage outputs a scanning pulse to the first gate line GL1 in response to the start pulse Vst and the clock signal CLK. Further, the 2nd to nth stages sequentially outputs a scanning pulse to the second to nth gate lines G2 to Gn, respectively, in response to an output signal from the corresponding previous stage and the clock signal CLK. In other words, the 1st to nth stages have the sane circuit configuration. At least two clock signals having different phases are used for providing the clock signal CLK.

FIG. 3 is a detailed circuit diagram of the 1st stage of the related art gate driving circuit shown in FIG. 2. Referring to FIG. 3, the 1st stage includes an output buffer and a controller. The output buffer includes a pull-up NMOS transistor NT6 and a pull-down NMOS transistor NT7. The pull-up NMOS transistor NT6 output a first clock signal CLK1 to an output line under control of a Q node. The pull-down NMOS transistor NT7 output a low-level driving voltage VSS to the output line under control of a QB node. The controller includes NMOS transistors NT1 to NT5 for controlling the Q node and the QB node. The 1st stage is supplied with high-level and low-level voltages VDD and VSS, and a start pulse Vst. Four clock signals CLK1 to CLK4 with different phases are available, three of which, CLK1, CLK3 and CLK4 are supplied to the 1st stage.

FIG. 4 is a driving waveform diagram for the 1st stage shown in FIG. 3. Referring to FIG. 4, during a first time period A, the NMOS transistors NT1 and NT2 are turned on by high-level voltages from the start pulse Vst and the fourth clock signal CLK4 to thereby pre-charge the high-level voltage of the start pulse Vst into the Q node. The pull-up NMOS transistor NT6 is turned on by a high-level voltage pre-charged into the Q node to thereby supply a low-level voltage from the first clock signal CLK1 to an output line, that is, the first gate line G1. At this time, the QB node is driven low by the NMOS transistor NT5, which is turned on by the start pulse Vst. Thus, the NMOS transistor NT3B and the pull-down NMOS transistor NT7 are turned off. The NMOS transistors NT3A and NT4 also are turned off by a low-level voltage from the third clock signal CLK3.

During a second time period B, the NMOS transistors NT1 and NT2 are turned off by low-level voltages from the start pulse Vst and the fourth clock signal CLK4, so that the Q node floats to a high state, while the pull-up NMOS transistor NT6 remains on. Then, a high-level voltage from the first clock signal CLK1 bootstraps the Q node due to a parasitic capacitance caused by an overlap between the gate electrode and the drain electrode of the pull-up NMOS transistor NT6. Thus, the Q node voltage jumps higher to turn on the pull-up NMOS transistor NT6, thereby rapidly supplying a high-level voltage from the first clock signal CLK1 to the first gate line G1.

During a third time period C, the NMOS transistors NT1 and NT2 are turned off by the low-level voltages from the start pulse Vst and the fourth clock signal CLK4, so that the Q node floats to a high state, while the pull-up NMOS transistor NT6 remains on. Thus, the pull-up NMOS transistor NT6 remains on to thereby supply a low-level voltage from the first clock signal CLK1 to the first gate line G1.

During a fourth time period D, the NMOS transistors NT3A and NT4 are turned on by a high-level voltage from the third clock signal CLK3, so that the Q node is discharged into a low-level voltage while the QB node is charged into a high-level voltage. The high-level voltage at the QB node turns on the NMOS transistor NT3B to accelerate the discharge of the Q node, and the pull-down NMOS transistor N7 is turned on to supply a low-level voltage to the first gate line G1.

During a fifth time period E, the NMOS transistors NT4 and NT5 are turned off by a low-level voltage from the third clock signal CLK3. The QB node floats to a high state. The pull-down NMOS transistor N7 remains on to supply a low-level voltage to the first gate line G1. Further, the pull-down NMOS transistor NT7 remains on continuously until the high-level voltage of the start pulse Vst is supplied.

FIG. 5 is a schematic plan view of a liquid crystal display panel with a built-in gate driving circuit according to the related art. Referring to FIG. 5, the related art gate driving circuit having the above-mentioned configuration is built in a liquid crystal display panel 10 by using an amorphous silicon thin film transistor. A size of an output buffer of each stage, for example, the pull-up and pull-down NMOS transistors NT6 and NT7, is set to have a very large value due to a low mobility. This is due to the fact that the scanning pulse is directly applied via the output buffer, as described above, and that a channel width of the output buffer has a large impact on the life of the liquid crystal display panel 10. According to a design constraint, the output buffer must have a channel width of more than thousands of millimeters (mm). The channel width can be more than ten thousands of microns (μm) in order to drive a medium-to-large liquid crystal display panel of more than ten (10) inches. For this reason, an area occupied by the built-in gate driving circuit 30 must be enlarged. However, product standardization limits how much the circuit area can be enlarged within the non-display area. Accordingly, a bi-directional driving method has been proposed, which provides first and second gate driving circuits 30 and 40 at each outer side of a display area 20 as shown in FIG. 5 to concurrently drive the gate lines of the display area 20 at each side thereof.

FIG. 6 is a plan view of the related art liquid crystal display panel with a built-in gate driving circuit of FIG. 5. Referring to FIG. 6, the i-th gate line Gi concurrently receives scanning pulses from the ith stage 32i from the first gate driving circuit 30 and the i-th stage 42i from the second gate driving circuit 40, thereby applying a data signal on the data line D, via the thin film transistor TFT connected to the gate line Gi, to the pixel electrode 44. Next, the (i+1)-th gate line Gi+1 is driven by scanning pulses concurrently received from the (i+1)-th stage 32i+1 from the first gate driving circuit 30 and the (i+1)-th stage 42i+1 from the second gate driving circuit 40. As shown in FIG. 6, each of the stages 32i and 32i+1 from the first gate driving circuit 30, or each of the stages 42i and 42i+1 from the second gate driving circuit 40, includes an output buffer 54 having pull-up and pull-down transistors NT6 and NT7, and a controller 52 having transistors NT1 to NT5 for controlling the output buffer 54. Further, a line on glass (LOG) area 50 is provided with a plurality of LOG-type signal lines for supplying a plurality of clock signals and power signals. The LOG area 50 is located at the outer portion of the stages 32i and 32i+1 of the first gate driving circuit 30 and the outer portion of the stages 42i and 42i+1 of the second driving circuit 40. Also, a sealant (not shown) is coated onto the outer portion of the LOG area 50 for joining the thin film transistor substrate with the color filter substrate. Since the sealant contains a glass fiber that can cause corrosion when in contact with food, the first and second gate driving circuits 30 and 40 and the LOG area 50 are located at the inner side thereof so that they do not overlap with the sealant.

Therefore, a line width of the circuit area at which the first and second gate driving circuits 30 and 40 can be provided is limited to the non-display area at the inner side of the sealant. A length for one stage is limited to one liquid crystal cell. Thus, the size of the output buffer 54 is not enlarged. Accordingly, a scheme capable of enlarging the area of the built-on driving circuit is needed.

SUMMARY OF THE INVENTION

Accordingly, the present invention is directed to a liquid crystal display panel having a built-in driving circuit that substantially obviates one or more of the problems due to limitations and disadvantages of the related art.

An object of the present invention to provide a driving circuit that reduces a distortion of a scanning pulse waveform in a liquid crystal display panel.

Another object of the present invention is to provide a driving circuit that prolongs the life of a liquid crystal display panel.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal display panel includes liquid crystal cells forming a matrix in a display area of the liquid crystal display panel; odd and even gate driving circuits provided at an outer area of the display area, the display area being positioned between the odd and even gate driving circuits, the odd driving circuit including a plurality of odd stages, the even driving circuit including a plurality of even stages; a plurality of gate lines, including even gate lines and odd gate lines in the liquid crystal cell matrix, the odd gate lines being driven by the odd driving circuit, and the even gate lines being driven by the even driving circuit, wherein a length of each of the odd stages and the even stages corresponds to size larger than a length of the liquid crystal cell.

In another aspect, a liquid crystal display panel includes liquid crystal cells forming a matrix in a display area of the liquid crystal display panel; odd and even gate driving circuits provided at an outer area of the display area, the display area being positioned between the odd and even gate driving circuits, the odd driving circuit including a plurality of odd stages, the even driving circuit including a plurality of even stages; a plurality of gate lines, including even gate lines and odd gate lines in the liquid crystal cell matrix, the odd gate lines being driven by the odd driving circuit, and the even gate lines being driven by the even driving circuit, wherein a start pulse of each of the odd stages includes an output signal from a previous one of the even stages, and a start pulse of each of the even stages includes an output signal of a previous one of the odd stages.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

Figure 1:
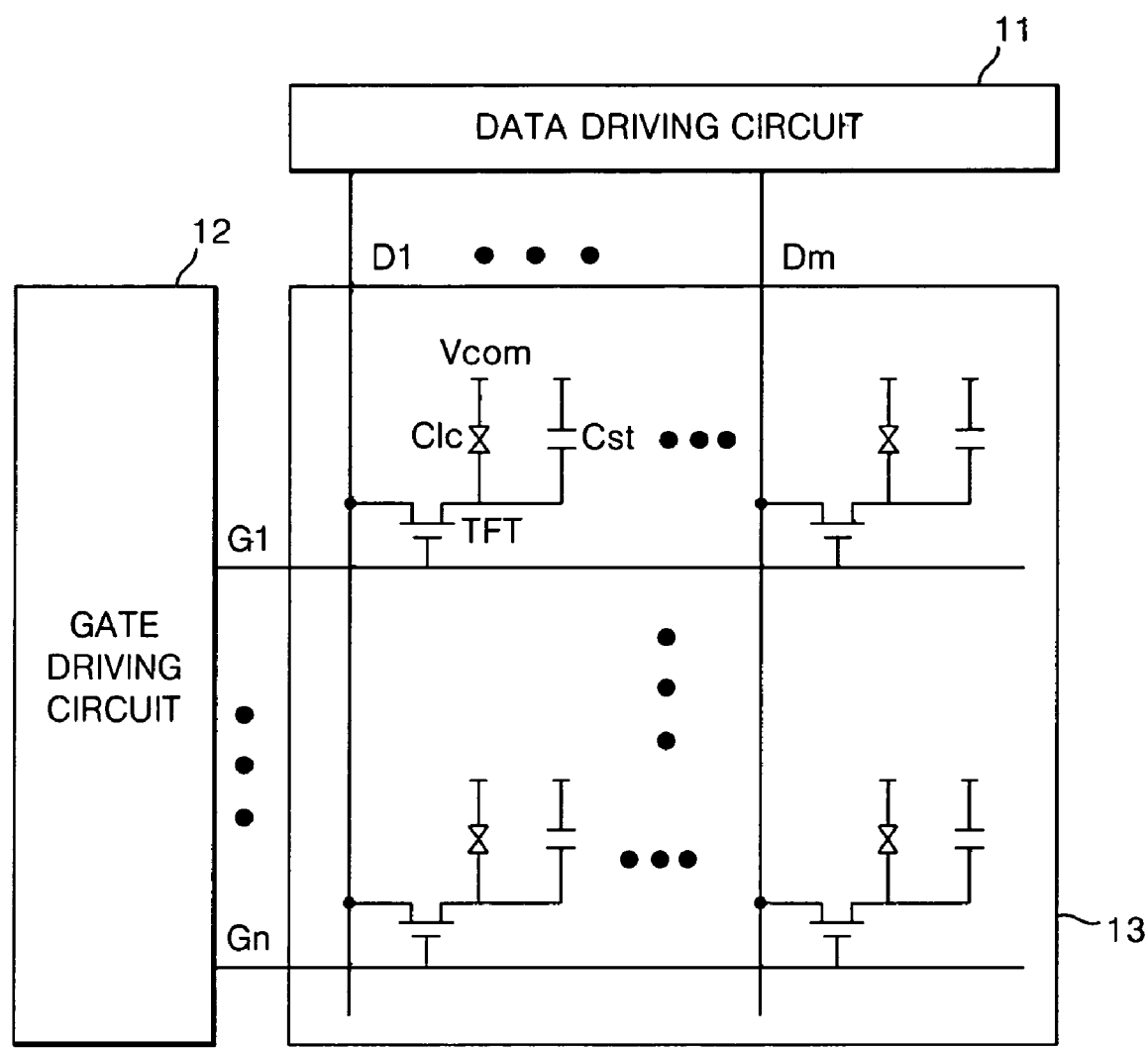
FIG. 1 is a block circuit diagram showing a configuration of a related art liquid crystal display device.
Figure 2:
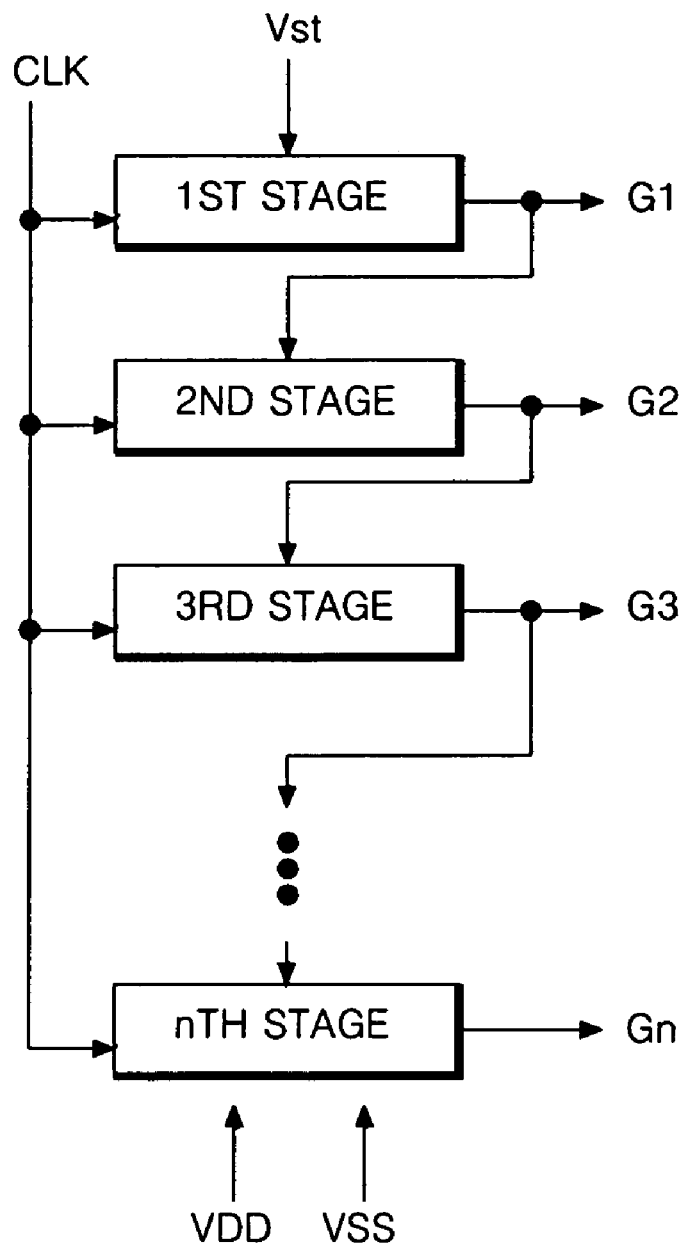
FIG. 2 is a block diagram showing a configuration of a gate driving circuit shown in FIG. 2 according to the related art.
Figure 3:
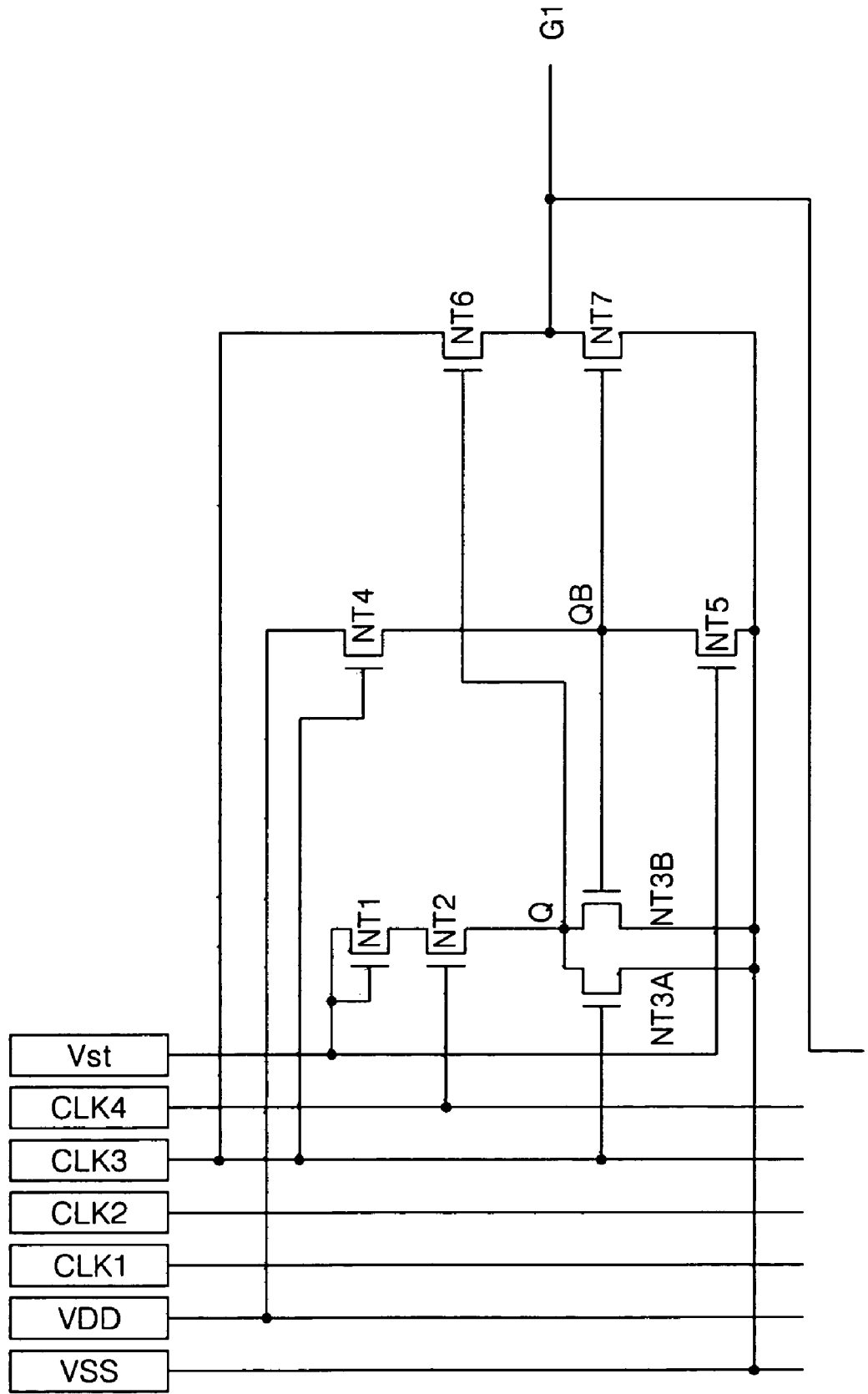
FIG. 3 is a detailed circuit diagram of the 1st stage of the related art gate driving circuit shown in FIG. 2.
Figure 4:
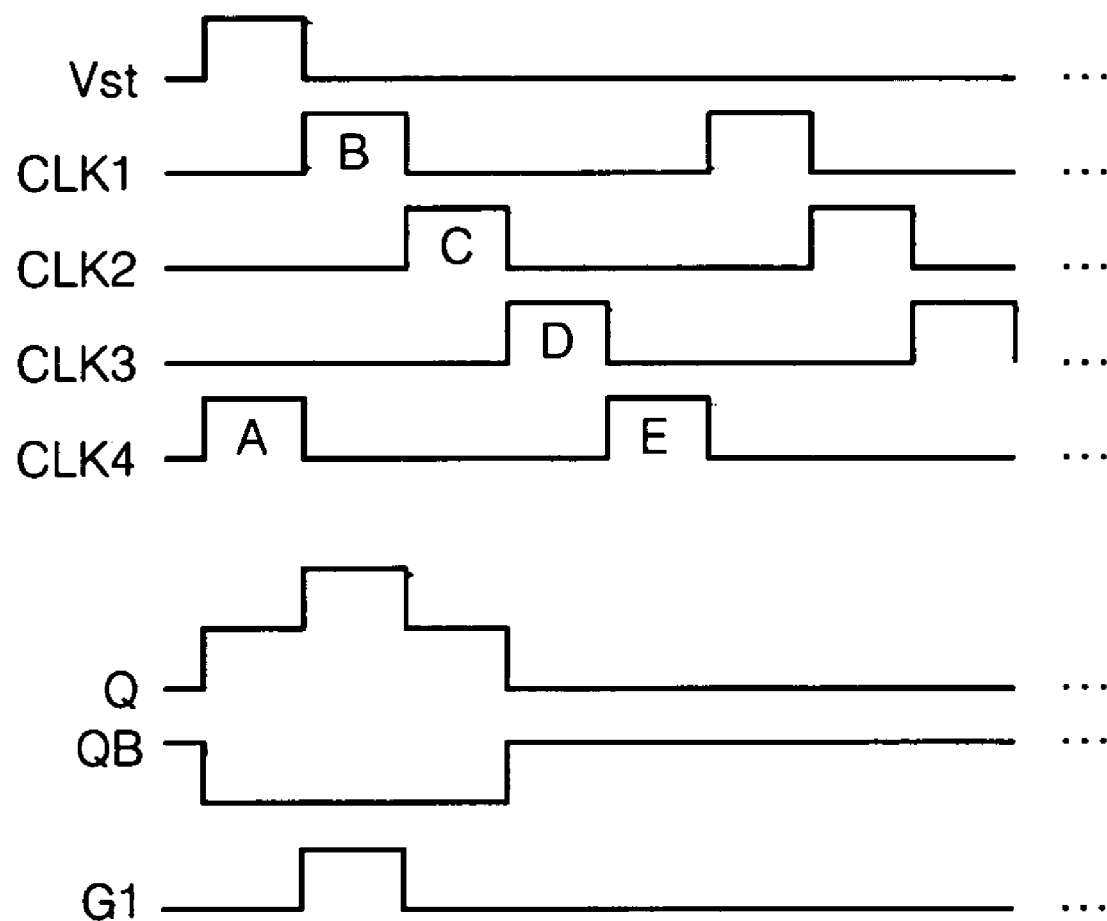
FIG. 4 is a driving waveform diagram for the 1st stage shown in FIG. 3.
Figure 5:
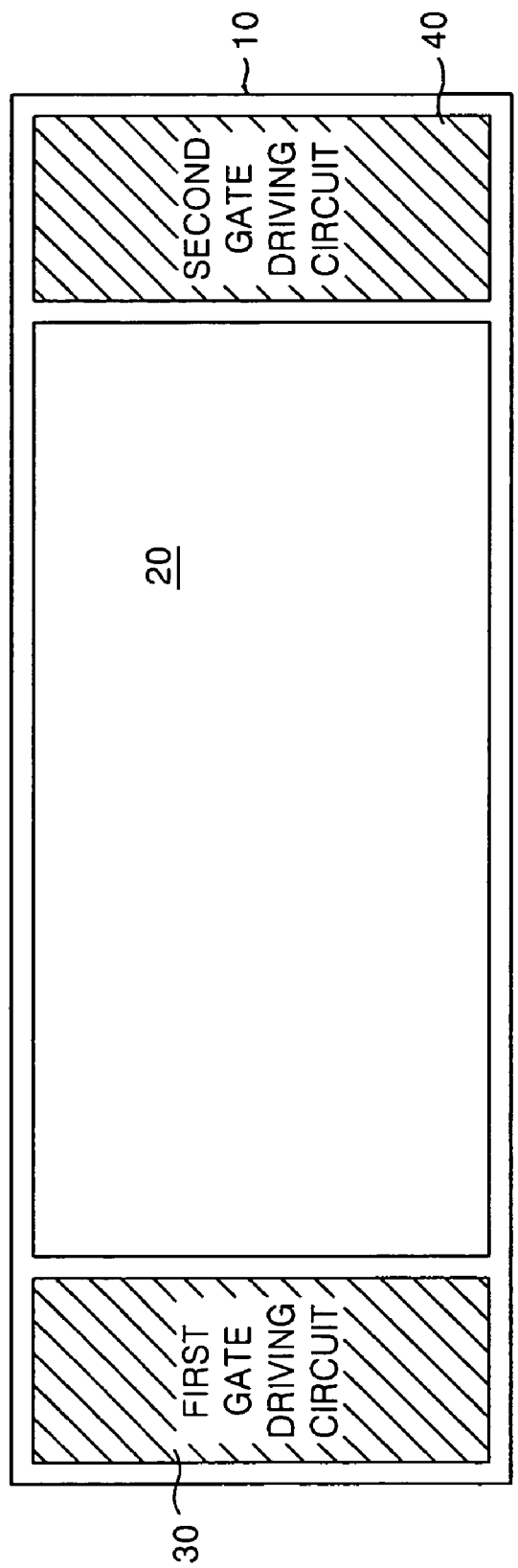
FIG. 5 is a schematic plan view of a liquid crystal display panel with a built-in gate driving circuit according to the related art.
Figure 6:
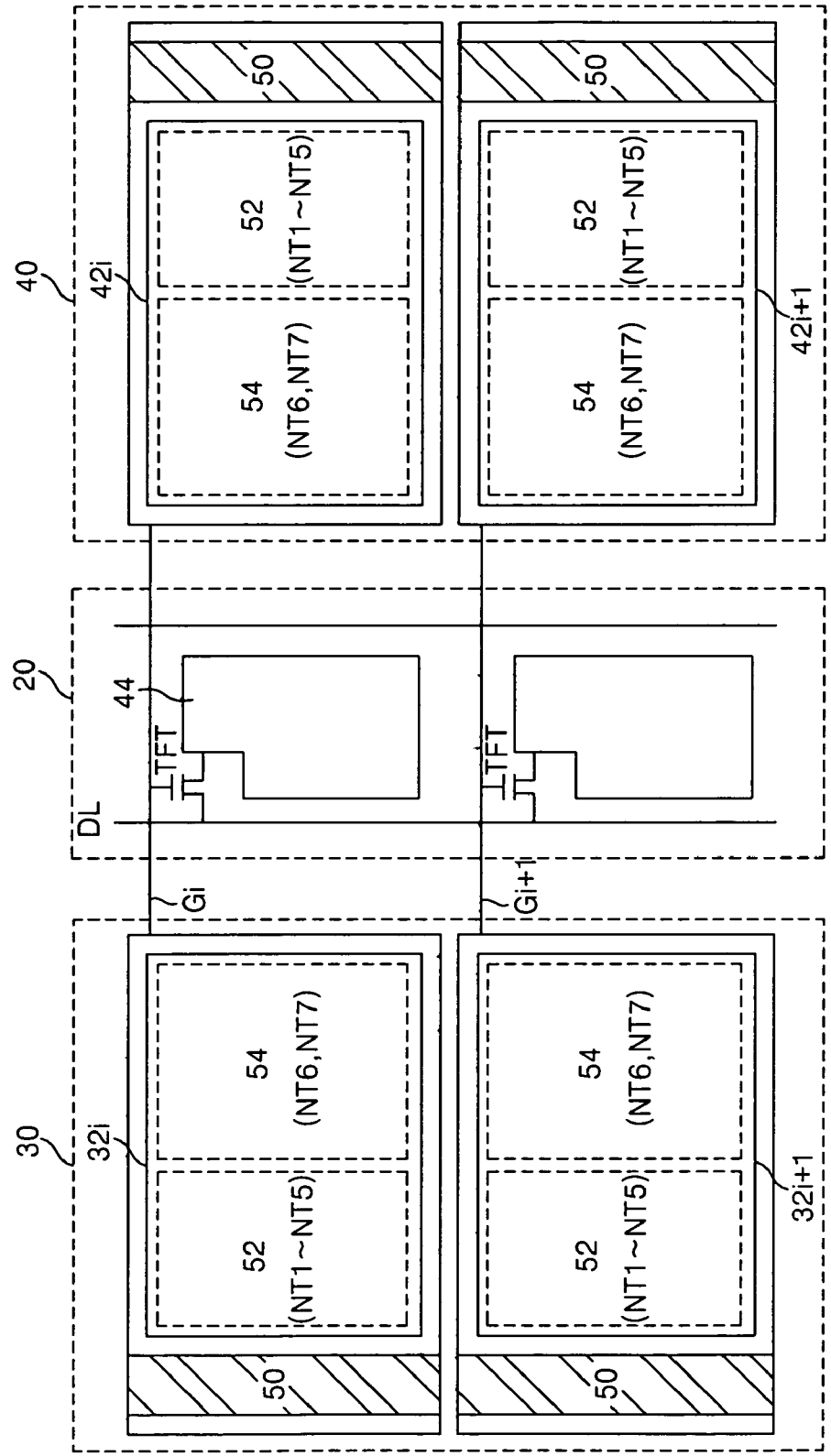
FIG. 6 is a plan view of the related art liquid crystal display panel with a built-in gate driving circuit of FIG. 5.
Figure 7:
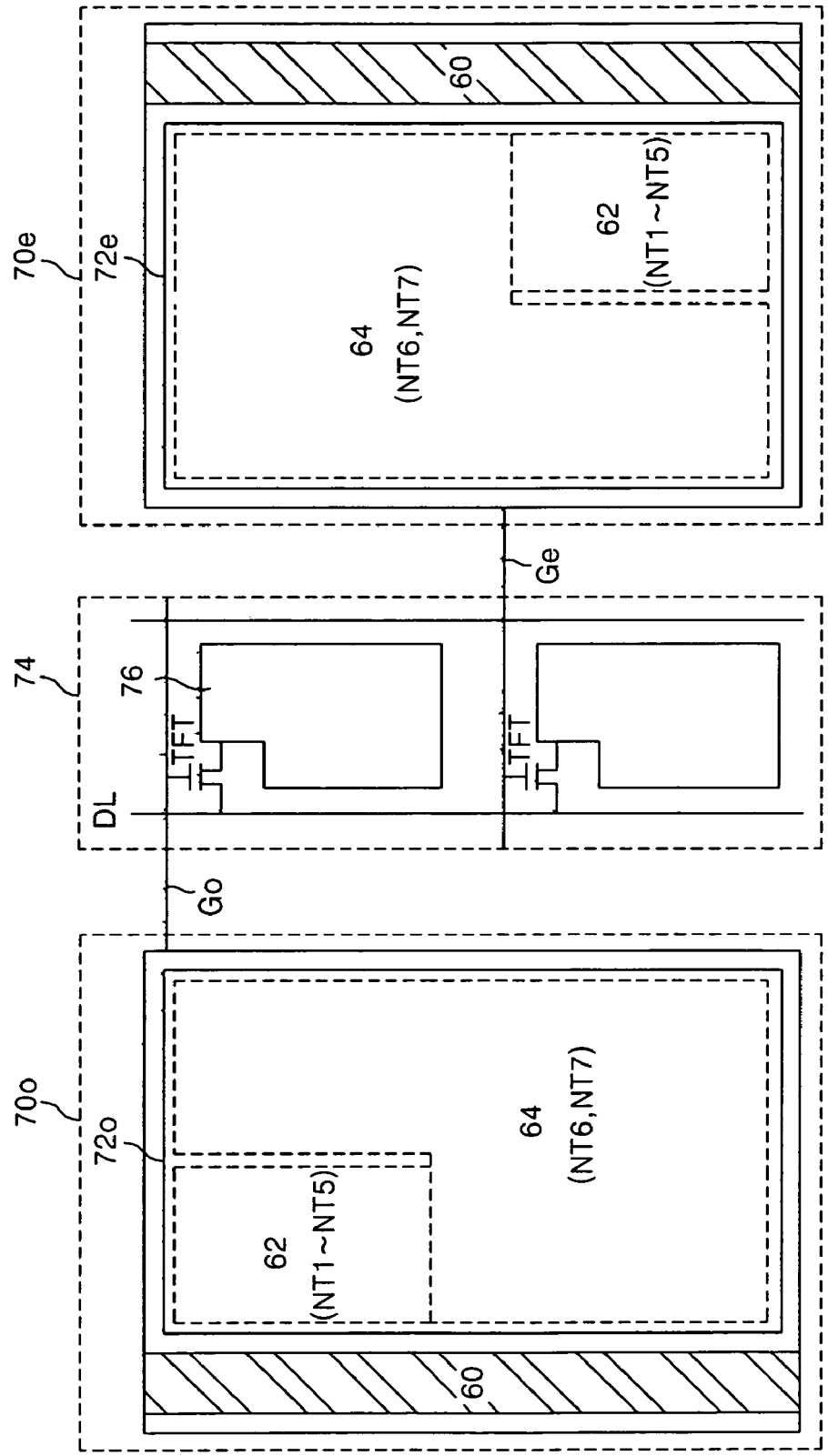
FIG. 7 is a schematic plan view of an exemplary portion of a thin film transistor substrate of a liquid crystal display panel with a built-in gate driving circuit according to a first embodiment of the present invention.

FIG. 7 is a schematic plan view of an exemplary portion of a thin film transistor substrate of a liquid crystal display panel with a built-in gate driving circuit according to a first embodiment of the present invention. Referring to FIG. 7, a thin film transistor substrate includes a display area 74, and odd and even gate driving circuits 70o and 70e built in a non-display area at each side of the display area 74. The display area 74 is provided with gate lines G and data lines D crossing each other. Crossings of the gate lines G and the data lines G define pixel regions in the display area 74. A thin film transistor TFT is connected at a crossing of one of the gate lines G and one of the data lines D. Liquid crystal cells (not shown) are provided in each pixel region. A pixel electrode 76 of the liquid crystal cell in each pixel region is connected to the corresponding thin film transistor TFT in that pixel region. The pixel regions, and the liquid crystal cells within the pixel regions, are arranged in a matrix. The odd and even gate driving circuits 70o and 70e provided in the non-display area drive the gate lines. Specifically, the odd and even gate driving circuits 70o and 70e drive corresponding odd gate lines Go and even gate lines Ge. The odd gate driving circuit 70o includes an odd stage 72o for driving the odd gate line Go, while the even gate driving circuit 70e includes an even stage 72e for driving the even gate line Ge.

As shown in FIG. 7, each of the odd stage 72o and the even stage 72e includes an output buffer 64 including pull-up and pull-down transistors NT6 and NT7, and a controller 62 including first to fifth transistors NT1 and NT5 for controlling the output buffer 64. A line on glass (LOG) area 60 is located at an outer portion of each of the odd stage 72o and the even stage 72e. The LOG area 60 is provided with a plurality of LOG-type signal lines (not shown) for supplying a plurality of clock signals and power signals (not shown in FIG. 7). Because the gate lines are divided into odd gate lines Go and even gate lines Ge driven by the odd stage 72o and the even stage 72e, respectively, a length of each of the stages 72o and 72e can be increased to correspond to two liquid crystal cells. Accordingly, the size of the output buffer 64 can be increased by more than 50% of that of the controller 62, which occupies a relatively small area in proportion to such an enlarged area of each stage 72o and 72e. For instance, the controller 62 in each of the stages 72o and 72e occupies an area corresponding to a length of one liquid crystal cell, while the output buffer 64 may cover an area corresponding to a length of two liquid crystal cells. Thus, the relative position of the controller 62 and the output buffer 64 in the odd stage 72o is horizontally rotated by 180 degrees in the even stage 72e. Accordingly, a channel width of the output buffer 64 can be increased to more than ten thousands microns (10,000 pm) required for the medium-to-large panel of more than 10 inches.

Figure 8:
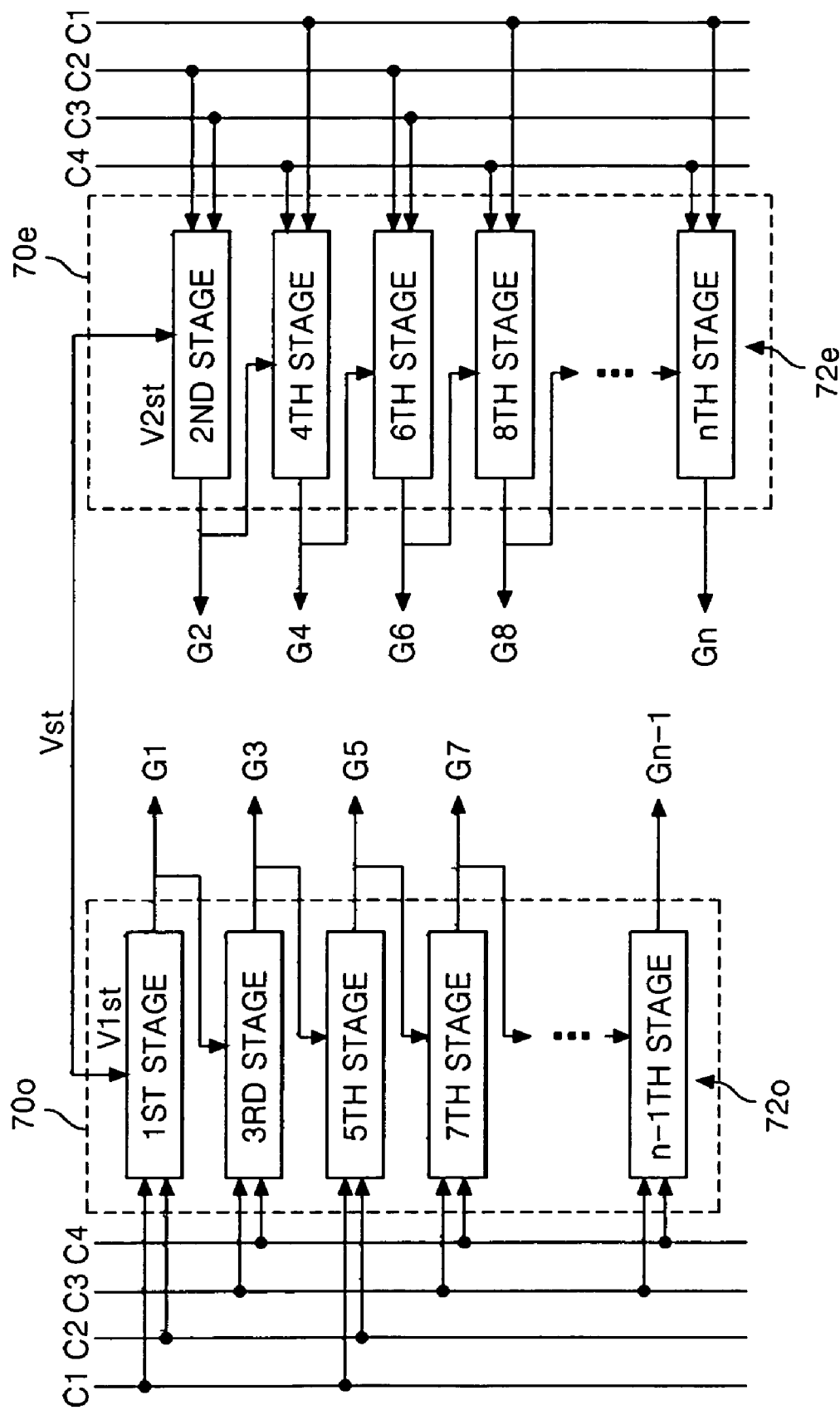
FIG. 8 is a schematic view for a method of driving odd and even gate driving circuits according to the first embodiment of the present invention.

FIG. 8 is a schematic view for a method of driving odd and even gate driving circuits according to the first embodiment of the present invention. Referring to FIG. 8, the odd driving circuit 70o includes 1st, 3rd, 5th, . . . , (n−1)-th odd stages. The even driving circuit 70e includes 2nd, 4th, 6th, . . . , n-th even stages. Each of the 1st, 3rd, 5th . . . , and (n−1)-th odd stages receives an input scanning pulse as a start pulse from the preceding odd stage and shifts it sequentially, thereby driving the odd gate lines G1, G3, G5, . . . , and Gn−1. On the other hand, each of the 2nd, 4th, 6th, . . . , and n-th even stages receives an input scanning pulse as a start pulse from the preceding even stage and shifts it sequentially, thereby driving the even gate lines G2, G4, G6, . . . , and Gn. Then, if an even start pulse V2st and an even clock signal externally supplied to the even gate driving circuit 70e are delayed by one clock period in comparison with an odd start pulse V1st and an odd clock signal externally supplied to the odd gate driving circuit 70o, respectively, then the gate lines G1, G2, G3, G4, . . . , Gn−1, and Gn can be sequentially driven. Herein, the odd gate lines G1, G3, G5, . . . , and Gn−1 have an opened structure with respect to the even gate driving circuit 70e, whereas the even gate lines G2, G4, G6, ..., and Gn have an opened structure with respect to the odd gate driving circuit 700.

Figure 9:
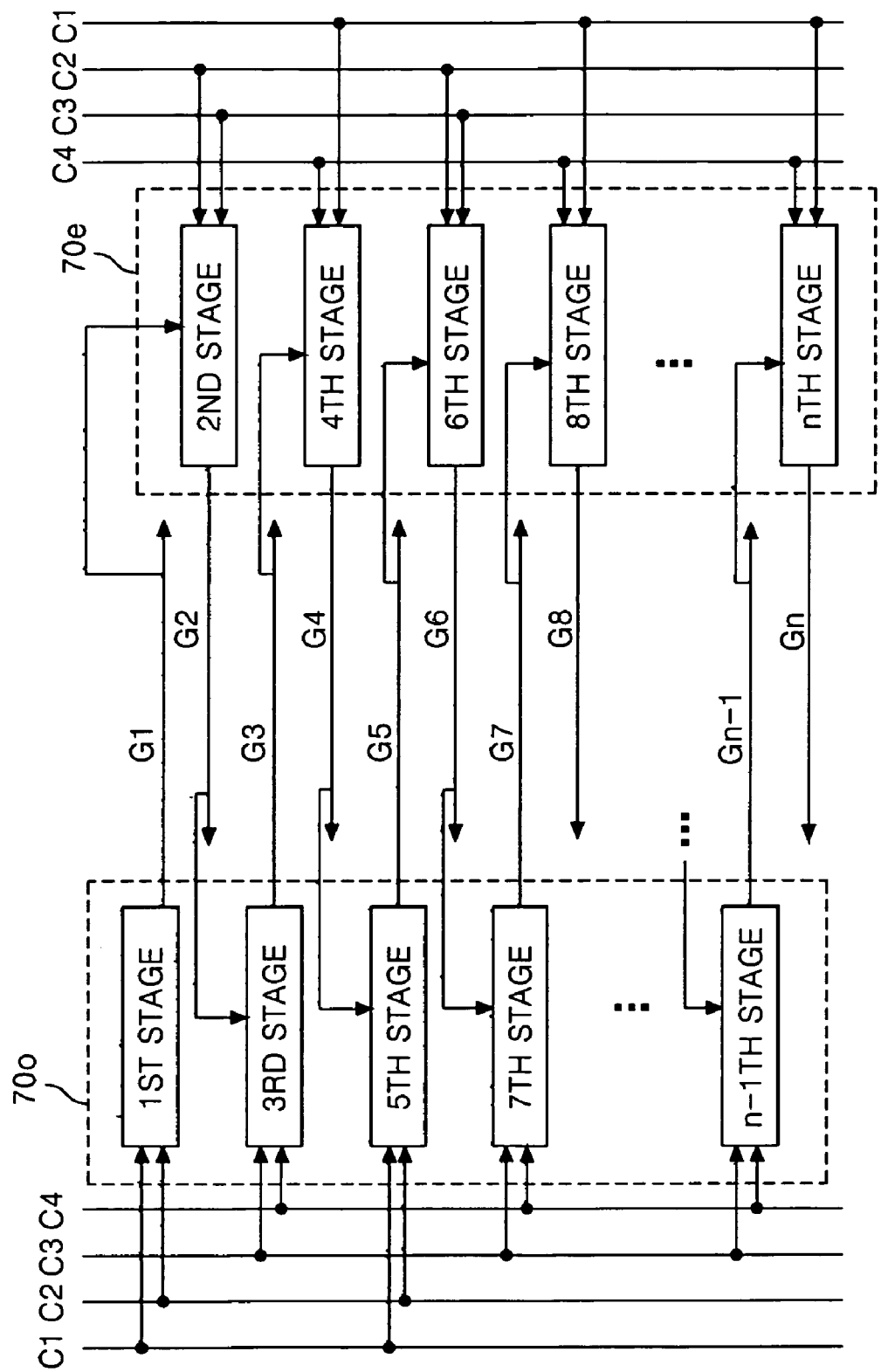
FIG. 9 is a schematic view for a method of driving odd and even gate driving circuits according to a second embodiment of the present invention.

FIG. 9 is a schematic view for a method of driving odd and even gate driving circuits according to a second embodiment of the present invention. Referring to FIG. 9, the odd driving circuit 700 includes 1st, 3rd, 5th, (n−1)-th odd stages. The even driving circuit 70e includes 2nd, 4th, 6th, ..., n-th even stages. Each of the 2nd, 4th, 6th, ..., and n-th even stages from the even driving circuit 70e receives an input scanning pulse as a start pulse from the preceding 1st, 3rd, 5th, ..., or (n−1)-th odd stage, respectively, and shifts it sequentially, thereby driving the even gate lines G2, G4, G4, ..., and Gn. On the other hand, each of the 1st, 3rd, 5th, ..., and (n−1)-th odd stages from the odd driving circuit 70o receives an input scanning pulse as a start pulse from the preceding 2nd, 4th, 6th, ..., or n-th even stage, respectively, and shifts it sequentially, thereby driving the odd gate lines G1, G3, G5, ..., and Gn−1.

The first odd stage 1st applies a scanning pulse to the first odd gate line G1 and applies the same scanning pulse to the first even stage 2nd connected to the first odd gate line G1 as a start pulse. Next, the first even stage 2nd applies a scanning pulse to the first even gate line G2 and applies the same scanning pulse to the second odd stage 3rd as a start pulse. Thereafter, the second odd stage 3rd applies a scanning pulse to the second odd gate line G3 and applies the same scanning pulse as a start pulse to the second even stage 4th. In this manner, the odd stages 1st, 3rd, 5th, ..., and (n−1)-th and the even stages 2nd, 4th, 6th, ..., and n-th alternately use a scanning pulse of the preceding stage as a start pulse to thereby sequentially apply a signal to each gate line. In this case, the first stage 1 st of the odd gate driving circuit 70o is the only stage that receives an externally supplied start pulse Vst, whereas the odd and even gate driving circuits 70o and 70e are similarly supplied with at least two clock signals.

Figure 10:
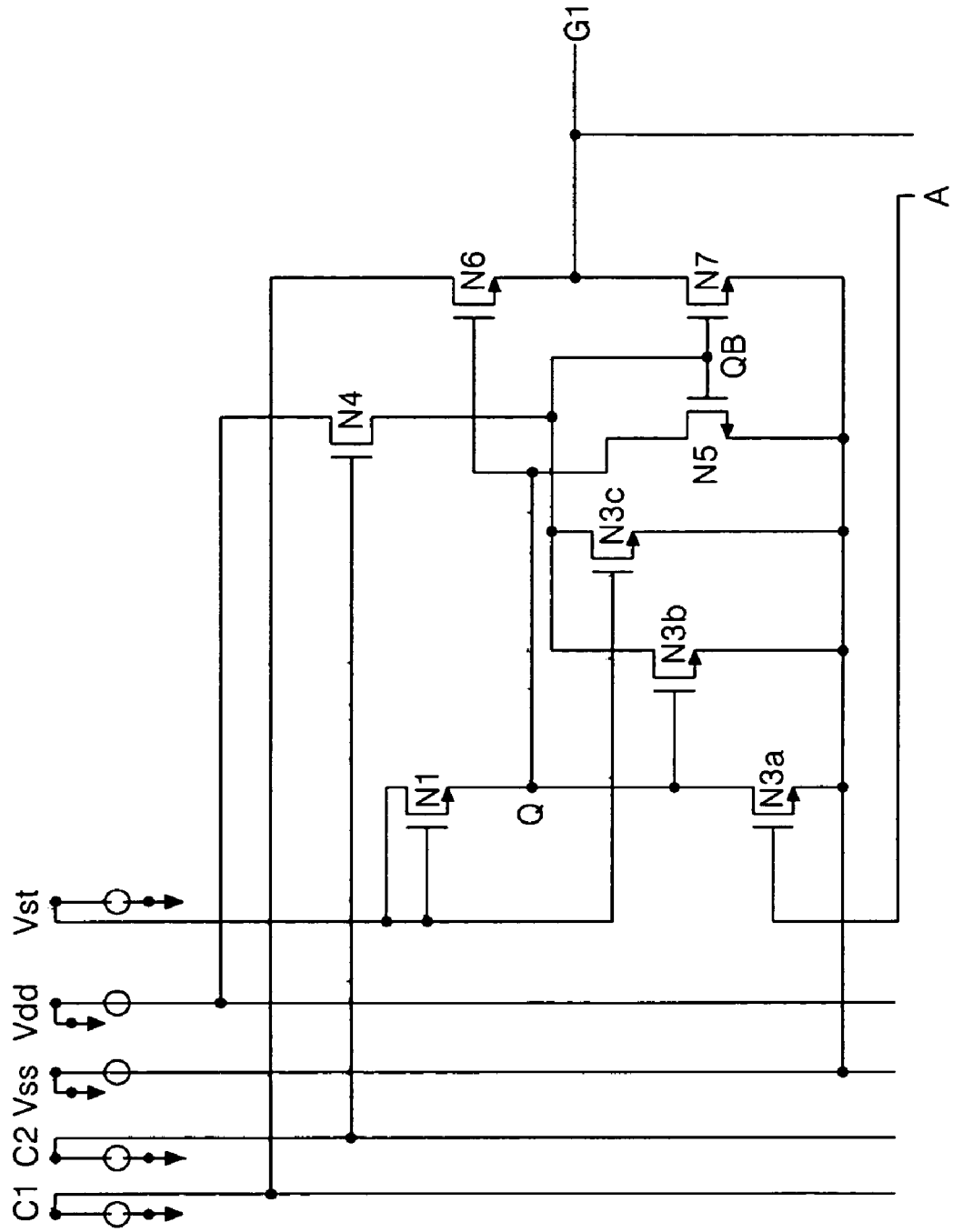
FIG. 10 is an exemplary circuit diagram of a first driving stage of the built-in gate driving circuit.
Figure 11:
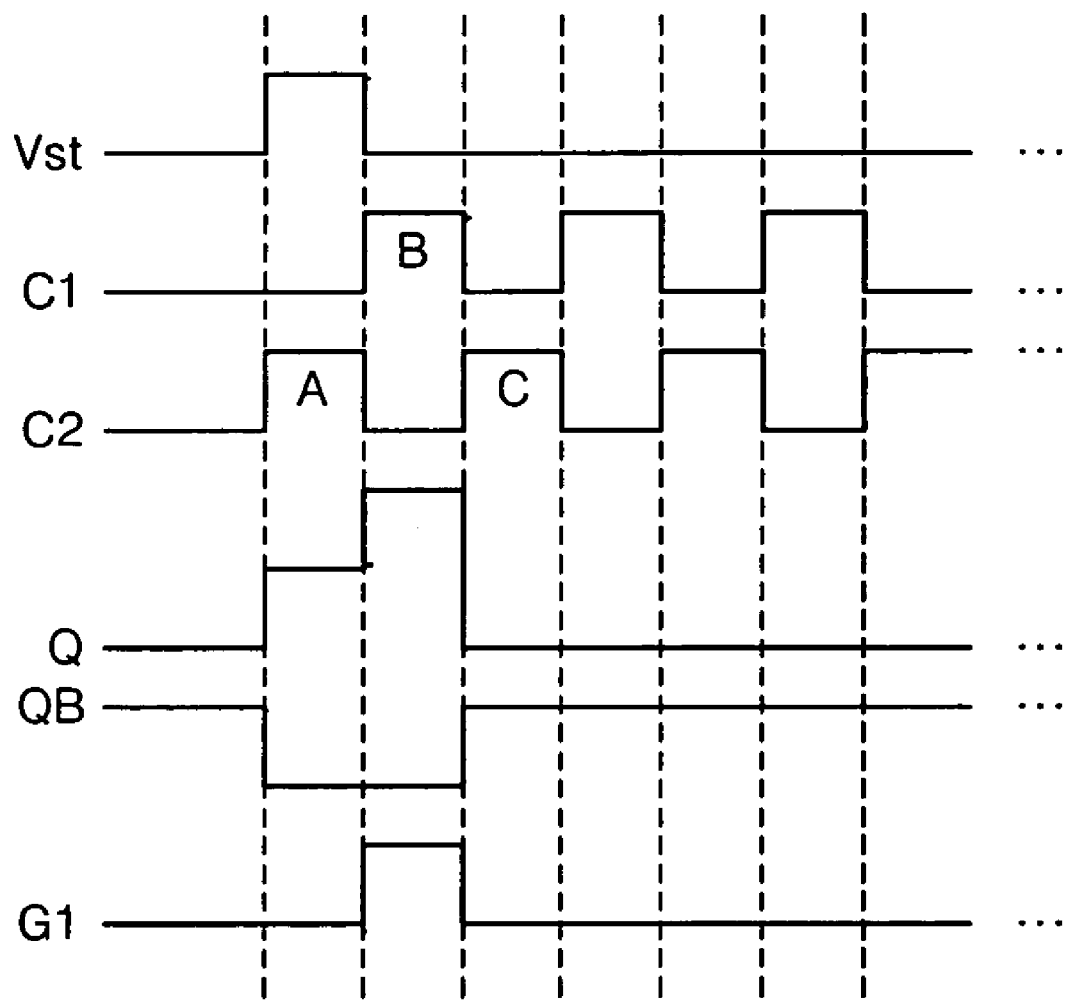
FIG. 11 is an exemplary waveform diagram for driving the bi-phase gate driving circuit of FIG. 10.

FIG. 10 is an exemplary circuit diagram of a first driving stage of the built-in gate driving circuit. Referring to FIG. 10, the first stage 1st includes an output buffer having, for example, a pull-up NMOS transistor NT6 for outputting a first clock signal C1 to an output line under control of a Q node and a pull-down NMOS transistor NT7 for outputting a low-level driving voltage VSS to the output line under control of a QB node. The first stage 1st also includes a controller having, for example, a plurality of NMOS transistors N1, N3a-N3c, N4, and N5 for controlling the Q node and the QB node. Such a 1st stage is supplied with high-level and low-level voltages Vdd and Vdd and a start pulse Vst. The first stage 1st is also provided with first and second clock signals C1 and C2 having different phases as shown in FIG. 11. The circuit diagram of FIG. 10 implements a bi-phase gate driving shift register circuit.

FIG. 11 is an exemplary waveform diagram for driving the bi-phase gate driving circuit of FIG. 10. Referring to FIG. 11, during a first time period A, the transistor N1 is turned on by high-level voltages provided by the start pulse Vst and the second clock signal C2. The transistor N1 pre-charges the high-level voltage provided by the start pulse Vst into the Q node. The pull-up NMOS transistor N6 is turned on by the high-level voltage pre-charged into the Q node. Thus, the pull-up NMOS transistor N6 supplies a low-level voltage from the first clock signal C1 to an output line, for example, the first gate line G1. The NMOS transistors N3b and N3c are turned on by the start pulse Vst, thereby forcing the QB node into a low state. Then, the pull-down NMOS transistors N5 and N7 are turned off.

During a second time period B, the first NMOS transistor N1 is turned off by low-level voltages from the start pulse Vst and the second clock signal C2. The Q node floats into a high state while the pull-up NMOS transistor N6 remains on. Then, a high-level voltage from the first clock signal C1 bootstraps the Q node due to a parasitic capacitance caused by an overlap between a gate electrode and a drain electrode of the pull-up NMOS transistor N6. Thus, as shown in FIG. 11, the voltage at the bootstrapped Q node jumps higher. The higher voltage at the bootstrapped Q node turns on the pull-up NMOS transistor N6, which supplies the high-level voltage from the first clock signal C1 to the first gate line G1.

During a third time period C, the NMOS transistor N3a is turned on by a gate output A from a next stage, and the NMOS transistor N4 is turned on by a high-level voltage of the second clock signal C2. The Q node is discharged to a low-level voltage while the QB node is charged to a high-level voltage. The NMOS transistor N5 is turned on by the high-level voltage at the QB node, thereby accelerating the discharge of the Q node. The pull-down NMOS transistor N7 is also turned on, thereby applying a low-level voltage to the first gate line G1.

Figure 12:
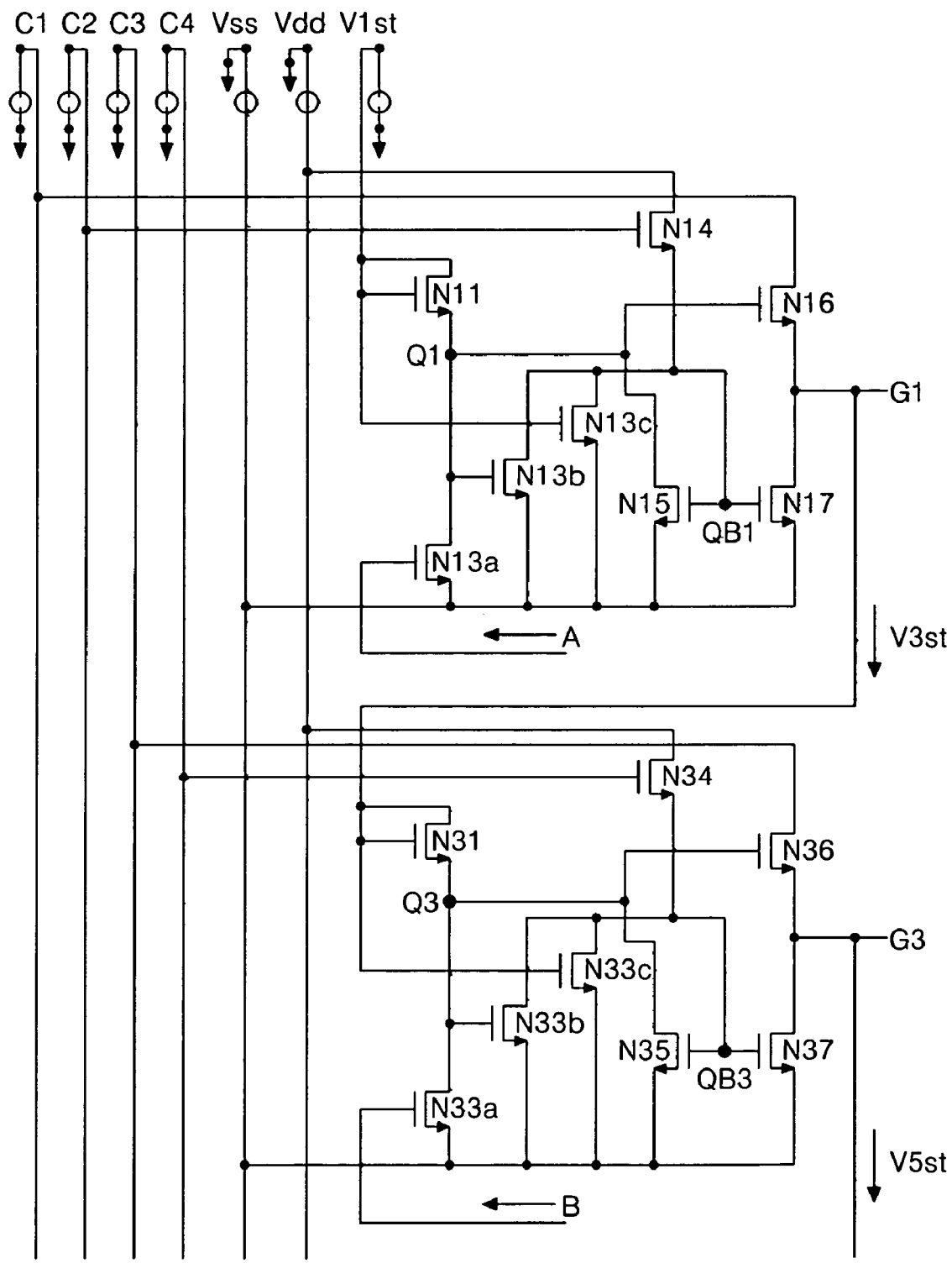
FIG. 12 is an exemplary circuit diagram of the first and third driving stages of the built-in gate driving circuit.
Figure 13:
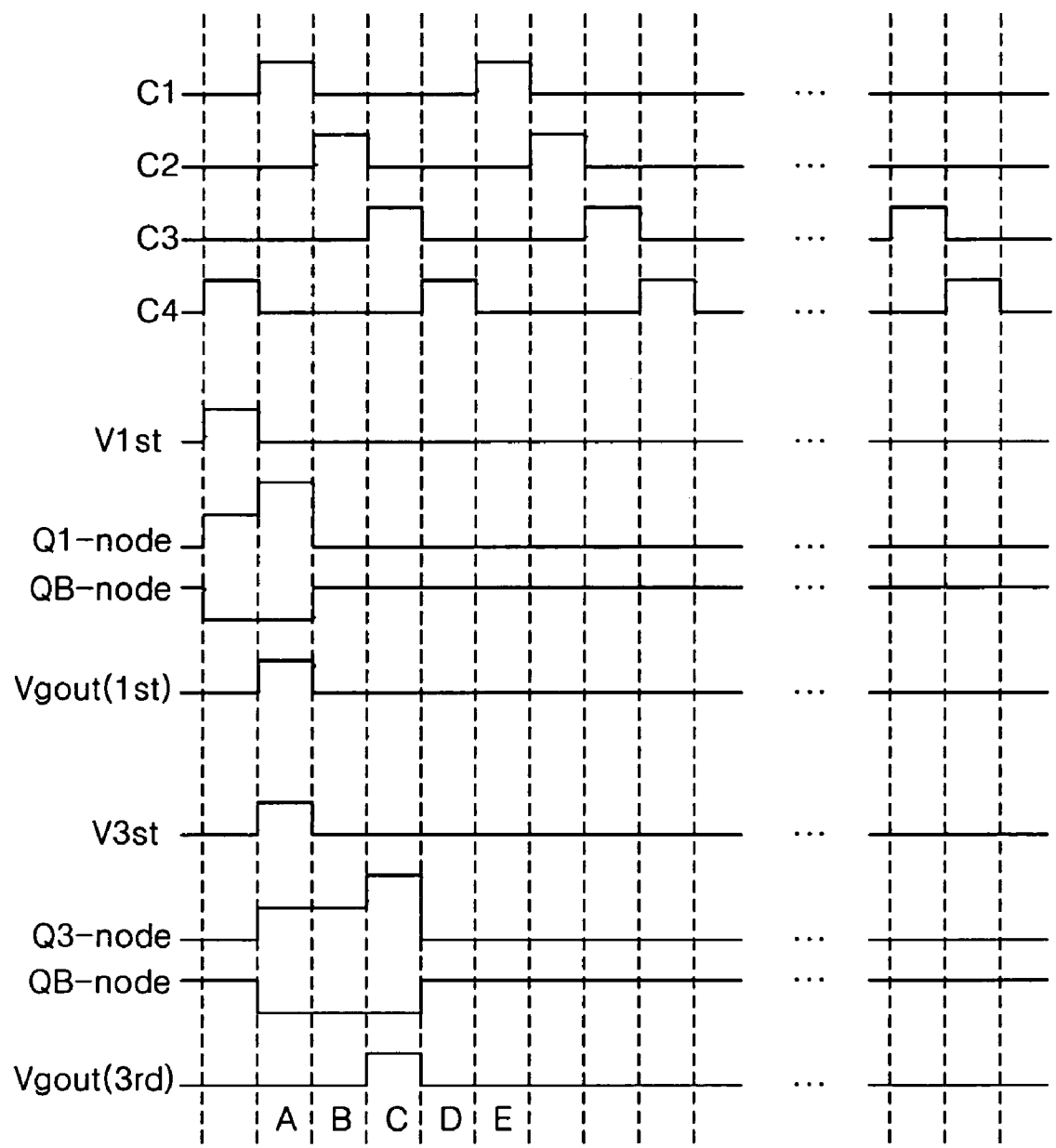
FIG. 13 is an exemplary waveform diagram for driving the four-phase gate driving circuit of FIG. 12.

FIG. 12 is an exemplary circuit diagram of the first and third driving stages of the built-in gate driving circuit. Referring to FIG. 12, the first and third stages, 1st and 3rd, are driven by a driving waveform generated from a four-phase gate driving shift register circuit. FIG. 13 is an exemplary waveform diagram for driving the four-phase gate driving circuit of FIG. 12. During a first time period A, transistor N11 in the first stage 1st is turned on by a high-level voltage from a start pulse V1st provided to the first stage 1st. The turned-on transistor N11 transistor pre-charges the high-level voltage from the start pulse V1st into a Q1 node of the first stage 1st. A pull-up NMOS transistor N16 is turned on by the high-level voltage pre-charged into the Q1 node. The turned-on NMOS transistor N16 supplies a low-level voltage from the first clock signal C1 to an output line, for example, the first gate line G1.

During a second time period B, the NMOS transistor N11 from the first stage 1st is turned off by a low-level voltage from the start pulse V1st. The Q1 node floats to a high state, while the pull-up NMOS transistor N16 remains on. Then, the high-level voltage from the first clock signal C1 bootstraps the Q1 node due to a parasitic capacitance caused by an overlap between the gate electrode and the drain electrode of the pull-up NMOS transistor N16. Thus, the Q1 node jumps to a higher voltage, thereby turning on the pull-up NMOS transistor N16. The turned-on NMOS transistor N16 rapidly supplies the high-level voltage from the first clock signal C1 to the first gate line G1. The high-level voltage from the first clock signal C1 is applied via a line connected to the third stage 3rd as a start pulse V3st of the third stage 3rd. Thus, the third stage 3rd supplies the start pulse V3st one horizontal period prior to an application of the third and fourth clock signals C3 and C4 to thereby pre-charge a Q3 node of the third stage 3rd during the second time period B.

During a third time period C, the NMOS transistor N11 is turned off by low-level voltages from the start pulse V1st and the first clock signal C1. The Q1 node floats to a high state while the pull-up NMOS transistor N16 remains on. Thus, the low-level voltage from the first clock signal C1 is applied to the first gate line G1. Further, the transistor N14 is turned on by the applied second clock signal C2. Thus, a high-level voltage Vdd is applied to the QB1 node, which becomes high. The transistor N15 and the pull-down NMOS transistor N17 are turned on by the high-level voltage at the QB1 node. Then, the transistor N15 discharges a voltage charged in the Q1 node, and the pull-down transistor N17 provides a low-level voltage to the first gate line G1 and remove a noise generated on the first gate line G1. Concurrently, the transistor N13a is turned on by an output A generated from the second stage (not shown) via the second gate line G2 (not shown) or fed back from the third stage 3rd. The turned-on transistor N13a rapidly discharges a voltage charged at the Q1 node along with the transistor N15. The transistor N31 is turned off by the low-level voltage from the start pulse V3st, forcing the Q3 node of the third stage 3rd to float to a high state.

During a fourth time period D, a high-level voltage of the third clock signal C3 is applied to the third stage 3rd. The high-level voltage of the third clock signal C3 is applied, via the transistor N36, to the third gate line G3 from the third stage 3rd. The output of the third stage 3rd on the third gate line G3 is applied as a start pulse V5st to the fifth stage 5th stage (not shown).

During a fifth time period E, a high-level voltage of the fourth clock signal C4 is applied to the third stage 3rd. The NMOS transistor N34 is turned on by the high-level voltage of the fourth clock signal C4. Thus, the QB3 node floats to a high state, and the pull-down NMOS transistor N37 remains on. The pull-down NMOS transistor N37 applies a low-level voltage to the third gate line G3 and cancels a noise generated on the third gate line G3. Further, the transistor N35 is turned on to discharge a voltage charged in the Q3 node. Concurrently, the transistor N33a is turned on by an output B generated from the fourth stage 4th (not shown) via the second gate line G2 (not shown) or supplied from the fifth stage 5th. Then, transistor N32 rapidly discharges a voltage charged at the Q3 node along with the transistor N35. Further, the pull-down NMOS transistors N17 and N37 remain continuously on until the high-level voltages of the start pulse V1st and V3st, respectively, are supplied, thereby preventing noise from being generated on the first gate line G1 and the third gate line G3.

In embodiments of the present invention, the liquid crystal display panel includes a four-phase driving circuit. As shown in FIG. 12, a Q node of such a driving circuit is charged during three horizontal periods in accordance with the third and fourth clock signals C3 and C4 applied to the 3rd stage. Thus, the output lines are charged sufficiently long to avoid gate driving error problems caused by a short charging time in high resolution applications. The Q nodes in subsequent stages of the driving circuit are also charged during three horizontal periods similarly to the 1st stage.

Figure 14:
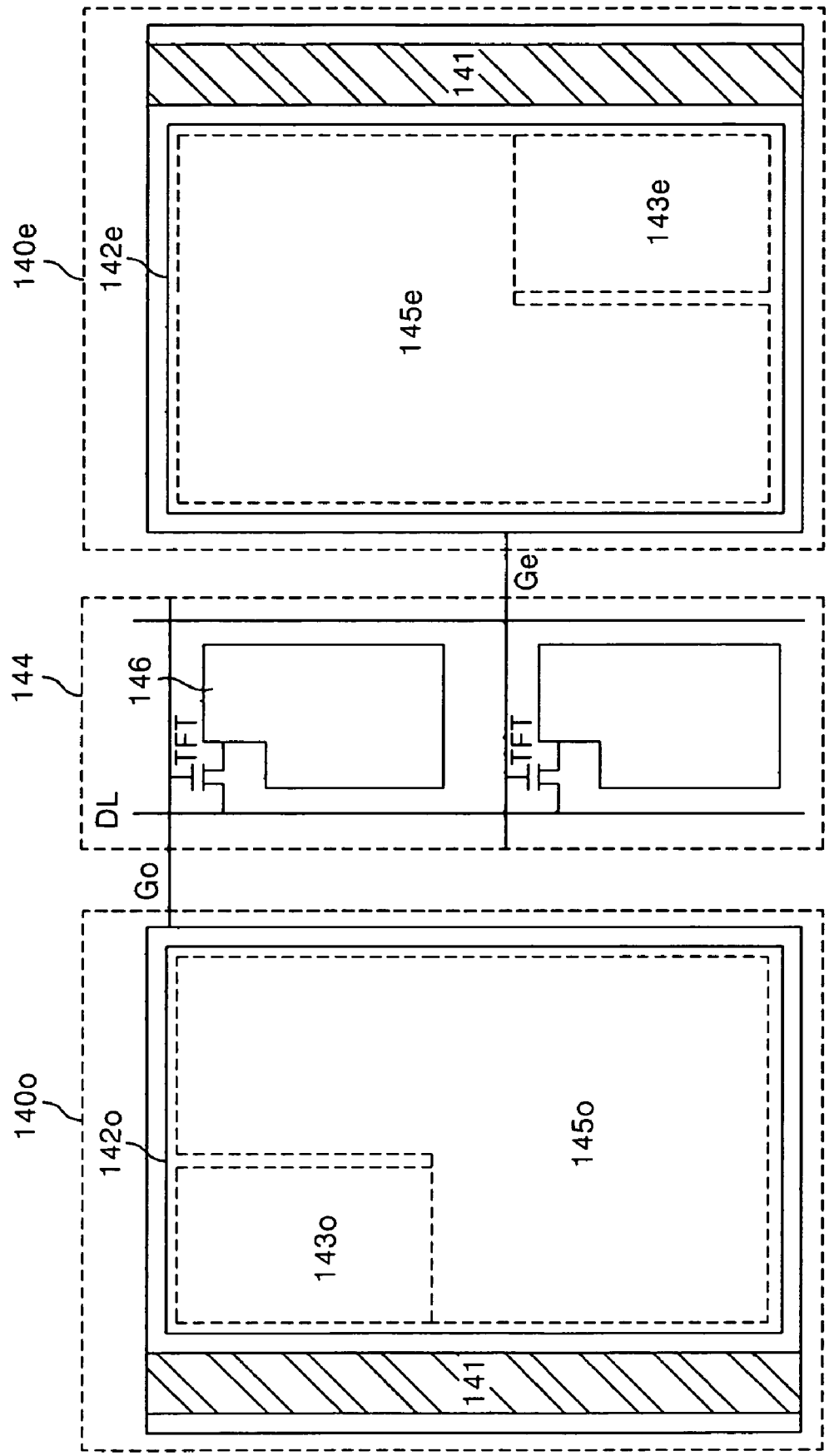
FIG. 14 is a schematic plan view of an exemplary portion of a thin film transistor substrate of a liquid crystal display panel with a built-in gate driving circuit according to a fourth embodiment of the present invention.

FIG. 14 is a schematic plan view of an exemplary portion of a thin film transistor substrate of a liquid crystal display panel with a built-in gate driving circuit according to a fourth embodiment of the present invention. Referring to FIG. 14, a thin film transistor substrate includes a display area 144, and odd and even gate driving circuits 140o and 140e built in a non-display area at each side of the display area 144. The display area 144 is provided with an n-number of gate lines G and an m-number of data lines D crossing each other. As an example, the number n of gate lines is equal to m/2, that is half of the m-number of data lines D. Crossings of the gate lines G and the data lines G define pixel regions in the display area 144. A thin film transistor TFT is connected at a crossing of one of the gate lines G and one of the data lines D. Liquid crystal cells (not shown) are provided in each pixel region. A pixel electrode 146 of the liquid crystal cell in each pixel region is connected to the corresponding thin film transistor TFT in that pixel region. The pixel regions, and the liquid crystal cells within the pixel regions, are arranged in a matrix.

Figure 16:
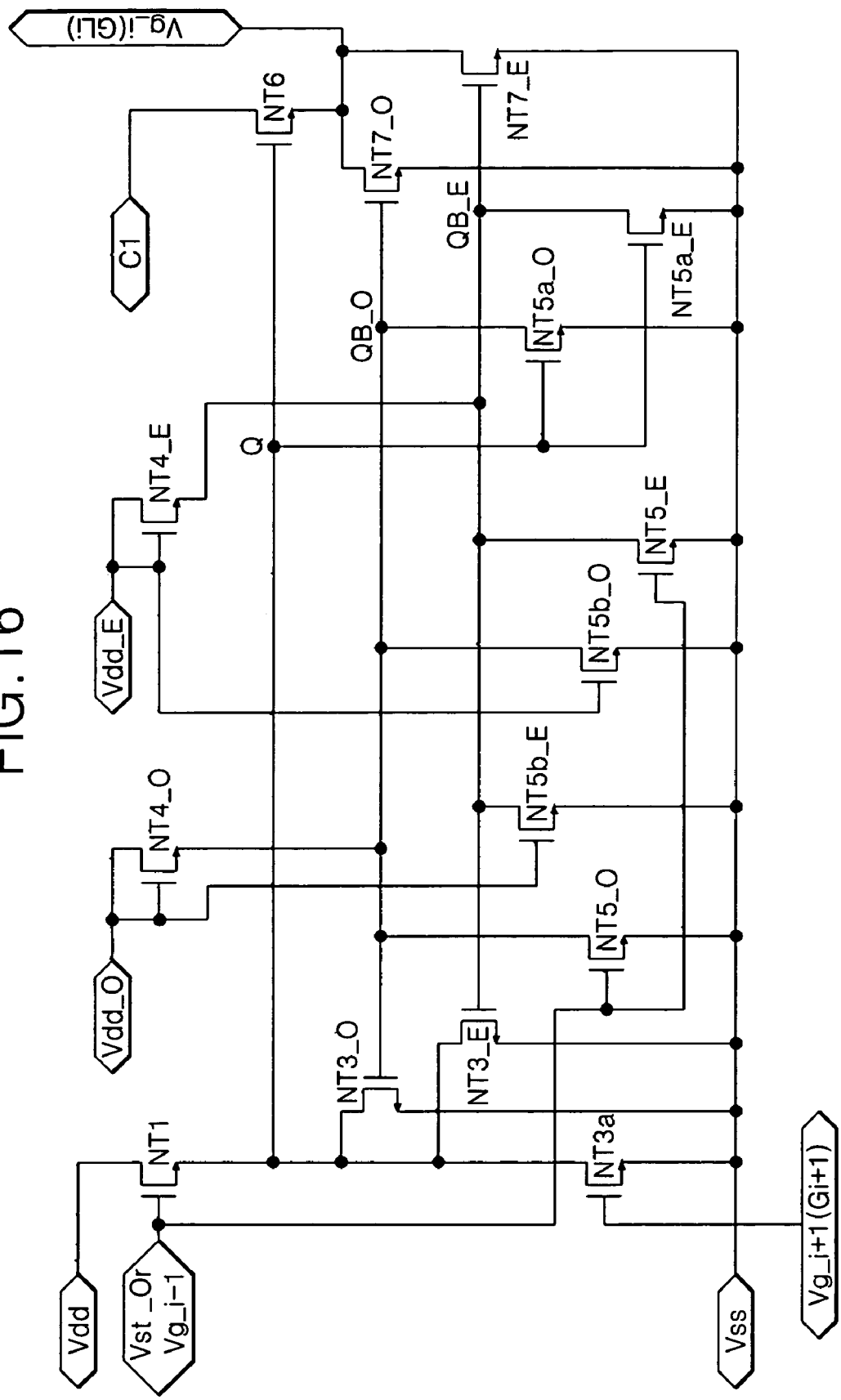
FIG. 16 is an exemplary circuit diagram of a driving stage of the built-in gate driving circuit of FIG. 15.
Figure 18:
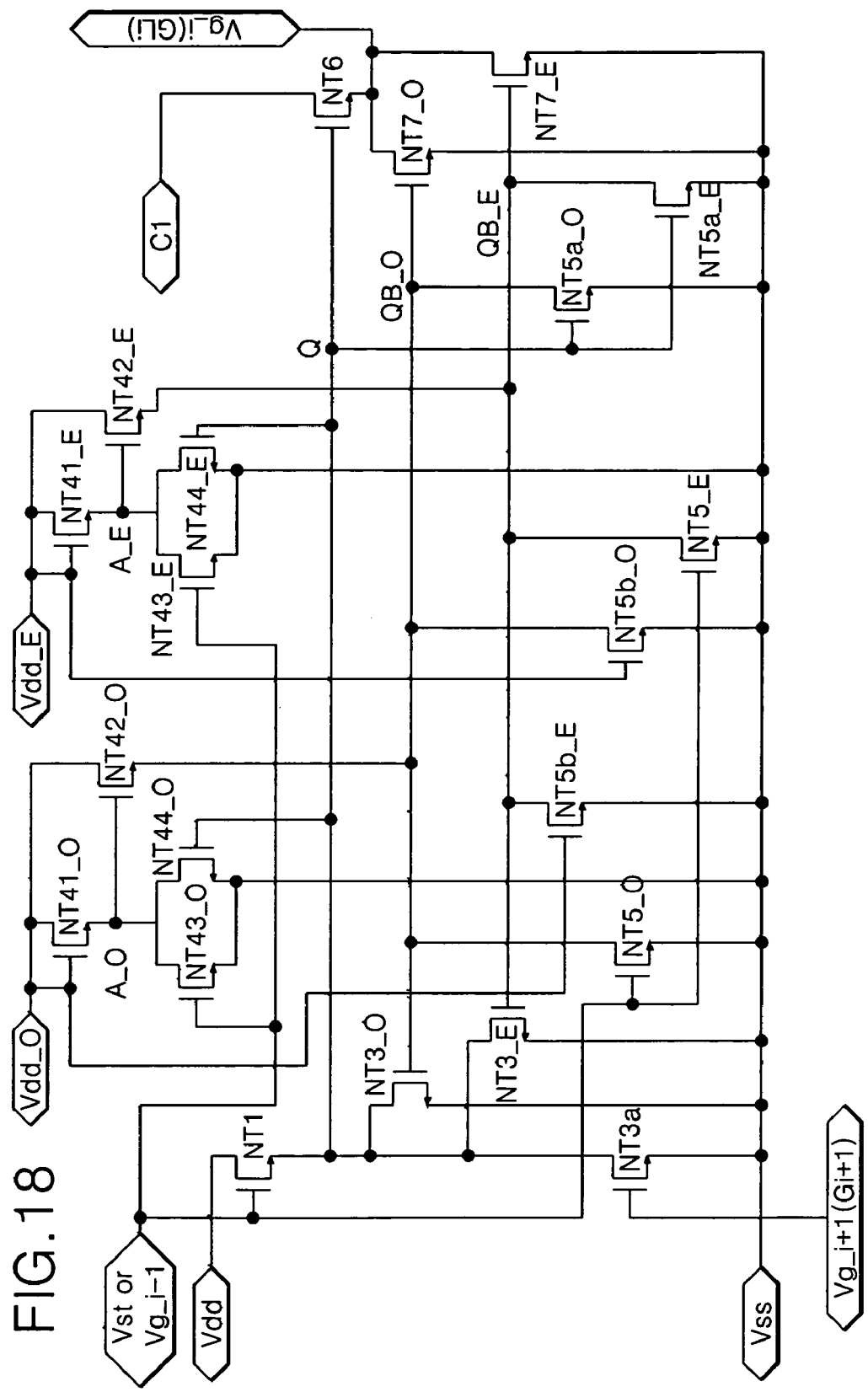
FIG. 18 is another exemplary circuit diagram of a driving stage of the built-in gate driving circuit of FIG. 15.

The odd and even gate driving circuits 140o and 140e provided in the non-display area drive the gate lines. Specifically, the odd and even gate driving circuits 140o and 140e drive corresponding odd gate lines Go and even gate lines Ge. The odd gate driving circuit 140o includes an odd stage 142o for driving the odd gate line Go, while the even gate driving circuit 140e includes an even stage 142e for driving the even gate line Ge. As shown in FIGS. 14, 16 and 18, each of the odd stage 142o and the even stage 142e includes output buffers 145o and 145e having pull-up transistor NT6 and pull-down transistors NT7_O and NT7_E, and a controllers 143o and 143e having a plurality of NMOS transistors for controlling the output buffers 145o and 145e. A LOG area 141 is located at the outer portion of each of the odd stage 142o and the even stage 142e. The LOG area 141 is provided with a plurality of LOG-type signal lines for supplying a plurality of clock signals and power signals. Because the gate lines are divided into odd gate lines Go and even gate lines Ge driven by the odd stage 142o and the even stage 142e, respectively, a length of each of the stages 142o and 142e can be increased to correspond to two liquid crystal cells. Accordingly, the size of the output buffers 145o and 145e can be increased by more than 50% of that of the controllers 143o and 143e, each which occupies a relatively small area in proportion to such an enlarged area of each stage 142o and 142e. For instance, the controllers 143o and 143e in each of the stages 142o and 142e occupies an area corresponding to a length of one liquid crystal cell, while each of the output buffers 145o and 145e may cover an area corresponding to a length of two liquid crystal cells. Thus, the relative position of the controller 143o and the output buffer 145o in the odd stage 142o is horizontally rotated by 180 degrees with respect to the controller 143e and the output buffer 145e in the even stage 142e.

As shown in FIGS. 16 and 18, an area is allocated in each of the stages 142o and 142e to form the output buffers 145o and 145e. Thus, a gate driving circuit, having two pull-down transistors NT7_O and NT_7E is provided at each stage. The gate driving circuit alternately operates the two pull-down transistors NT7_O and NT7_E in each time period to thereby prevent deterioration caused by a gate-bias stress of the pull-down transistors NT7_O and NT7_E. So the gate driving circuit may operate error-free and has a longer life.

Figure 15:
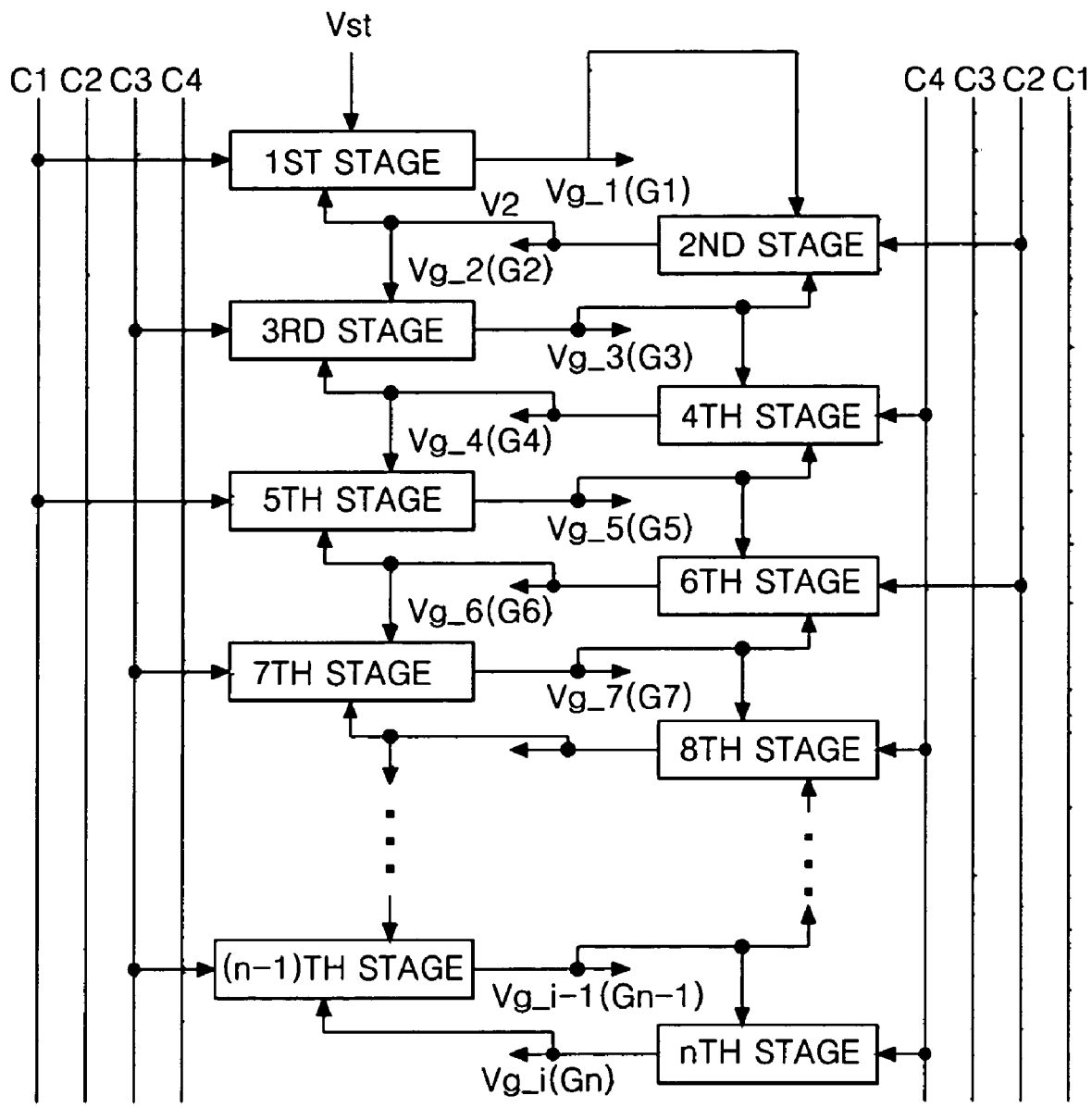
FIG. 15 is a schematic view for an exemplary method of driving odd and even gate driving circuits according to the fourth embodiment of the present invention.

FIG. 15 is a schematic view for an exemplary method of driving odd and even gate driving circuits according to the fourth embodiment of the present invention. Referring to FIG. 15, the odd driving circuit 140o includes 1st, 3rd, 5th, . . . , (n−1)-th odd stages. The even driving circuit 140e includes 2nd, 4th, 6th, . . . , n-th even stages. The first stage 1st receives as a start pulse the start signal Vst. Each of the remaining odd stages 3rd, 5th, . . . , (n−1)-th and the even stages 2nd, 4th, 6th, . . . , n-th receives as a start pulse an output signal Vg_i−1 from the previous stage i−1th stage. For example, the second stage 2nd receives start signal Vg_1 from the first stage. The third stage 3rd receives the start signal Vg_2 from the second stage 2nd. Furthermore, each of the even and odd stages responds to one of first to fourth clock signals C1, C2, C3 and C4. The one clock signal is supplied by delaying one clock period to apply the output signal Vg_i synchronized to the clock signal to the gate line Gi via an output buffer and a level-shifter (not shown). Furthermore, each of the odd and even stages 1st, 2nd, 3rd, 4th, . . . , and (n−1) receives an output signal Vg_i+1 from a next stage (i+1)-th as a reset pulse. The last stage n-th is provided with a reset pulse obtained from a dummy stage (not shown) by delaying one clock signal. Hereinafter, an operation of each stage will be described in detail with reference to a (4j+1)-th stage (herein, j is 0, 1, 2, 3, . . . , m/4).

Figure 17:
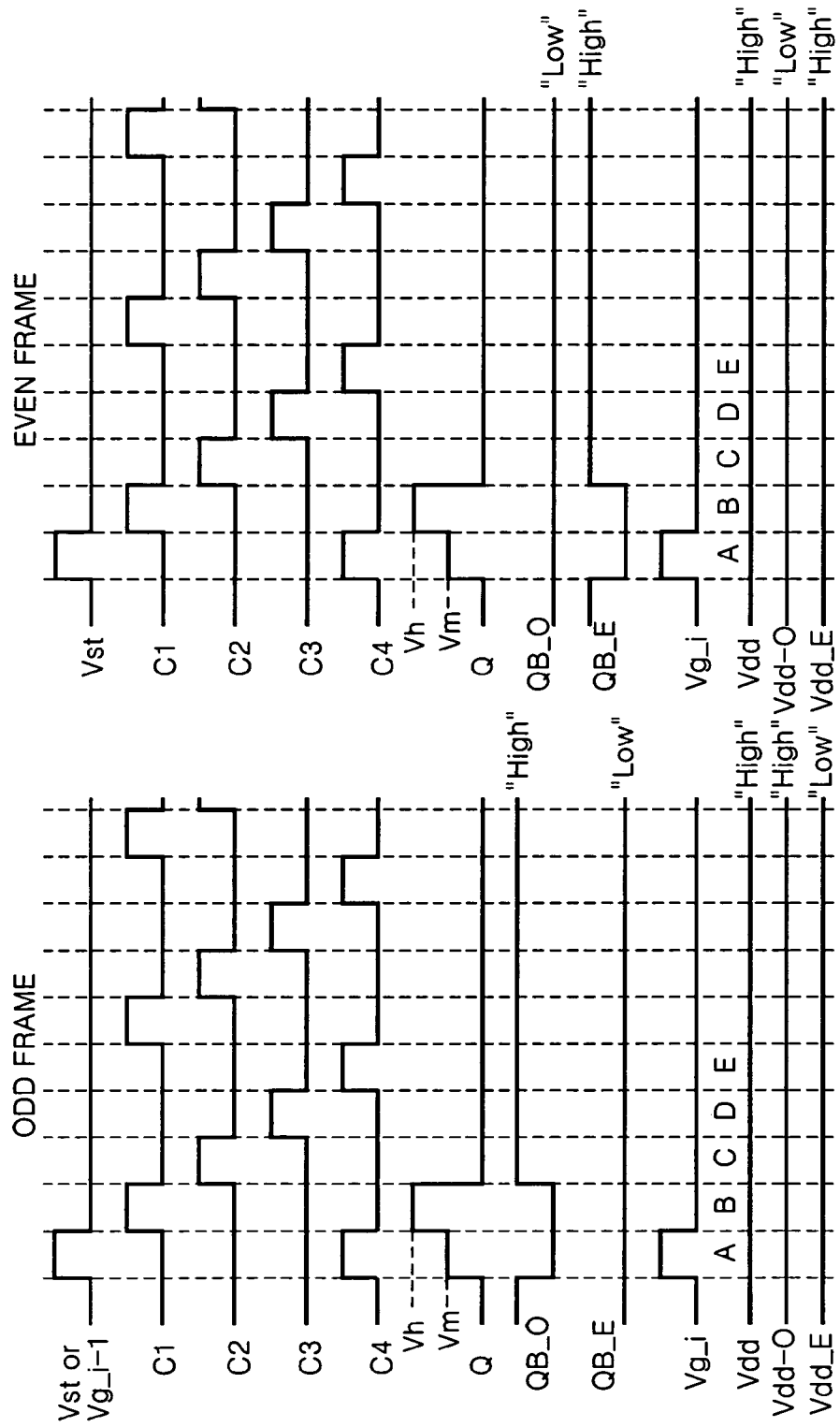
FIG. 17 shows exemplary waveforms applied to the built-in gate driving circuit of FIG. 15.

FIG. 16 is an exemplary circuit diagram of a driving stage of the built-in gate driving circuit of FIG. 15. FIG. 17 shows exemplary waveforms applied to the built-in gate driving circuit of FIG. 15. Referring to FIGS. 16 and 17, during a time period A within an odd frame period, first to third clock signals C1 to C3 are low, and a start signal Vst or a high level from a previous stage output signal Vg_i−1 is supplied to a gate electrode of the first, the transistors NT1, NT5_O and NT5_E, thereby turning-on the transistors NT1, NT5_O and NT5_E. Then, a low level voltage from a low level supply voltage Vss is supplied to QB_O and QB_E nodes via the transistors NT5_O and NT5_E. In other words, the QB_O and QB_E nodes are discharged during the A time period of the frame period. Moreover, the QB_O and QB_E nodes are held at a low level. The QB_O and QB_E nodes remain low, discharging the QB_O and QB_E nodes, thereby turning-off the NT3_O, NT3_E, NT7_O, and NT7_E. When the NT1 is turned-on, a high level supply voltage Vdd is applied to a Q node. The Q node is charged with a mid-level voltage Vm. The mid-level voltage Vm charged on the Q node turns-on the transistors NT5a_O and NT5a_E connected to the Q node.

During the time period A period, the start signal Vst or the output signal Vg_i−1 from a preceding stage is applied to a gate terminal of transistors NT5_O and NT5_E. Transistors NT5_O and NT5_E are turned-on. The turned-on transistors NT5_O, NT5_E, NT5a_O, NT5a_E form a discharge path for the QB_O and the QB_E nodes. Thus, the QB_O and the QB_E nodes are held at a low level. During the time period A of an odd frame, transistor NT6 is turned-on by the mid-level voltage Vm at the Q node. Because the first clock signal C1 is low, a current stage output signal Vg_i holds the voltage low. A high level supply voltage Vdd_O is applied to and turns-on transistors NT4_O and NT5b_E during an odd frame period. When transistor NT4_O is turned-on, the high level voltage is supplied to the QB_O node. Then, the voltage on the QB_O node increases to the high level voltage. But, the QB_O node remains low because transistors NT5_O and NT5a_O have wider channel widths than transistor NT4_O. Thus, the turned-on transistor NT4_O continually remains on during the odd frame period. The transistor NT5b_E forms a discharge path for the QB_E node. After the time period A, although the transistors NT5_E, NT5a_E are turned-off, the transistor NT5b_E continually remains on due to the high level supply voltage Vdd_O applied during the odd frame period, to thereby continually form the discharge path of the QB_E node during the odd frame period.

During a time period B of the odd frame period, the first clock signal C1 is inverted from the low level voltage to a high level voltage, and the start signal Vst is inverted from the high level voltage to a low level voltage. When transistor NT1 is turned-off, the discharge path of the Q node is intercepted. A voltage charged in a parasitic capacitance between the drain electrode and the gate electrode of transistor NT6 is added to the mid-level voltage Vm at the Q node, the voltage of the Q node further increases more than a threshold voltage of the sixth transistor NT6. In other words, the voltage of the Q node increases to a voltage higher than the voltage of the Q node during the time period A due to bootstrapping. Accordingly, during the time period B, transistor NT6 is turned-on, and an output signal Vg_i increases due to a voltage of the first clock signal C1 while transistor NT6 is on. Thus, transistor NT6 is inverted to the high level voltage. Further, the start signal Vst is inverted to a low level voltage to turn-off transistors NT5_O and NT5_E, but the transistors NT5a_O and NT5a_E, whose gate electrodes are connected to the Q node remain high, thus on. Accordingly, a discharge path is maintained at the QB_O and the QB_E nodes, thereby holding the voltage low.

During a time period C, the first clock signal C1 is inverted from the high level voltage to a low level voltage. The high level voltage from of a next stage output signal Vg_i+1 is supplied to a gate terminal of transistor NT3a to turn-on transistor NT3a. When transistor NT3a is turned-on, the high level voltage on the Q node is discharged through transistor NT3a, so that the voltage on the Q node is inverted to a low level voltage. The low level voltage applied at the Q node turns-off transistors NT5a_O and NT5a_E, whose gate electrodes are connected to the Q node, to thereby intercept the discharge path of the QB_O and the QB_E nodes. Accordingly, the high level voltage Vdd_O is supplied to the QB_O node via the turned-on transistor NT4_O during the odd frame period. The high level voltage supplied to the QB_O node turns-on transistors NT3_O and NT7_O, whose gate electrodes are connected to the QB_O node. An additional discharge path is formed through the turned-on transistor NT3a by turning on transistor NT3_O, and the output signal Vg_i is inversed to the low level voltage by turning on transistor NT7_O.

During a time period D, the next stage output signal Vg_i+1 is inverted to the low level voltage, to thereby turn-off the transistor NT3a. As described above, the QB_O node continually remains at the high level voltage provided by high level supply voltage Vdd_O supplied through the transistor NT4_O during the remaining odd frame period. Accordingly, the voltage at the Q node and the output signal Vg_i remains low during the remaining odd frame period. As described above, the QB_E node remains at the low level voltage provided by the transistor NT5b_E, which is turned-on by high level supply voltage Vdd_O provided during the odd frame period.

Now, the operation of the driving stage during the even frame period will be described. During a time period A of an even frame period, first to third clock signals C1 to C3 are low, and the start signal Vst or a high level voltage output signal Vg_i−1 from a previous stage is supplied to a gate electrode of the transistors NT1, NT5_O and NT5_E, to thereby turn-on the transistors NT1, NT5_O and NT5_E. When the transistors NT5_O and NT5_E are turned-on, low level supply voltage Vss supplies a low level voltage to the QB_O and the QB_E nodes via the transistors NT5_O and NT5_E. Accordingly, the QB_O and QB_E nodes are discharged, and QB_O and QB_E nodes are held at a low level voltage. The QB_O and QB_E nodes remain low, thereby holding transistors NT3_O, NT3_E, NT7_O, and NT7_E at a low level. Accordingly, a discharge path of the Q node is intercepted.

When transistor NT1 is turned-on, supply voltage Vdd applies a high level voltage to a Q node, to thereby charge the Q node with a mid-level voltage Vm. The mid-level voltage Vm charged on the Q node turns on the transistors NT5a_O and NT5a_E, whose gate electrodes are connected to the Q node. The transistors NT5a_O and NT5a_E provides a discharge path for the turned-on transistors NT5_O and NT5_E through the QB_O and the QB_E nodes by holding the QB_O and the QB_E nodes at a low level. When transistor NT6 is turned-on, because the first clock signal C1 remains low, a low level output signal is supplied to an output Vg_i of a current stage. A high level voltage of an even frame high level supply voltage Vdd_E turns-on the (4_E)th and the (5b_O)th transistors NT4_E and NT5b_O.

When the transistor NT4_E is turned-on, supply voltage Vdd_E provides a high level voltage to a QB_E node and then the voltage on the QB_E node increases to the high level voltage. But, the QB_E node remains low because the transistors NT5_E and NT5a_E have respectively wider channel width than the transistor NT4_E. Accordingly, the turned-on transistor NT4_E remains on due to the high level supply voltage Vdd_E supplied during the even frame period. The transistor NT5b_O forms a discharge path forf the QB_O node. After the A time period, although the transistors NT5_O and NT5a_O are turned-off, the (5b_O)th transistor NT5b_O continually maintains the turn-on state because of the high level supply voltage Vdd_E supplied during the even frame period, to thereby continually form the discharge path of the QB_O node during the even frame period.

During a time period B, the first clock signal C1 is inverted from a low level voltage to the high level voltage, on the other hand, the start signal Vst is inverted from the high level voltage to the low level voltage. At this time, when the first transistor NT1 is turned-off, the discharge path of the Q node is intercepted. Thereby, while a voltage charged in a parasitic capacitance between the drain electrode and the gate electrode of the sixth transistor NT6 is added to a mid-level voltage Vm floated on the Q node, the voltage of the Q node increases higher than a threshold voltage of the transistor NT6. In other words, a bootstrapping effect pulls the voltage at the Q node higher than the voltage of the Q node during the A period. Accordingly, during the B time period, the transistor NT6 is turned-on and an output signal Vg_i increases due to the first clock signal C1 applied by turned-on transistor NT6. Further, the start signal Vst is inverted to the low level voltage to turn-off the transistors NT5_O and NT5_E, but transistors NT5a_O and NT5a_E, whose gate electrodes are connected to the Q node held at a high level voltage, remain on. Accordingly, the discharge path of the QB_O and the QB_E nodes is maintained, to thereby maintain the low level voltage.

During a time period C period, the first clock signal C1 is inverted from a high level voltage to a low level voltage, and the high level voltage of a next stage output signal Vg_i+1 is supplied to a gate terminal of the transistor NT3a to turn-on the transistor NT3a. When transistor NT3a is turned-on, the high level voltage on the Q node is discharged through the transistor NT3a, so that the voltage on the Q node is inverted to the low level voltage. The low level voltage at the Q node turns-off the transistors NT5a_O and NT5a_E, whose gate electrodes are connected to the Q node, to thereby intercept the discharge path of the QB_O and the QB_E nodes. Accordingly, high level supply voltage Vdd_E applies a high level signal to the QB_E node via the turned-on transistor NT4_E.

The high level voltage supplied to the QB_E node turns-on the transistors NT3_E and NT7_E, whose gate electrodes are connected to the QB_E node. An additional discharge path is formed by the turned-on transistor NT3a by turning on the transistor NT3_E, and the output signal Vg_i is inverted to the low level voltage by turning on transistor NT7_E. The QB_O node, as described above, maintains the low level voltage provided by transistor NT5b_O, turned-on high level supply voltage Vdd_E during the even frame period.

During a time period D, the next stage output signal Vg_i+1 is inverted to the low level voltage, to thereby turn-off transistor NT3a. As described above, the QB_O node continually maintains the high level voltage provided by the high level supply voltage Vdd_E through the transistor NT4_O during the remaining even frame period. Accordingly, the voltage of the Q node and the output signal Vg_i remains low during the remaining even frame period.

FIG. 18 is another exemplary circuit diagram of a driving stage of the built-in gate driving circuit of FIG. 15. In an embodiment of the present invention, the driving waveform of FIG. 16 can be applied to FIG. 18. Accordingly, an operation of each stage applying the circuit of the FIG. 18 will be described in detail in reference to the (4j+1)th stage (herein, j is 1, 2, 3, . . . , m−4). During a time period A period, first clock signal to third clock signal C1 to C3 are low, and the start signal Vst or a high level voltage of the previous stage output signal Vg_i−1 is supplied to a gate electrode of transistors NT1, NT43_O, NT43_E, NT5_O and NT5_E, to thereby turn on the transistors NT1, NT43_O, NT43_E, NT5_O and NT5_E. When the transistors NT43_O and NT43_E are turned on, a low level supply voltage Vss supplies a low level voltage to A_O and A_E nodes via the transistors NT43_O and NT43_E. In other words, the A_O and A_E nodes are discharged, thereby maintaining the low level voltage at the A_O and the A_E nodes. The low level voltage on the A_O and the A_E nodes turns-off transistors NT42_O and NT42_E. The high level supply voltage Vdd_O applies a high level voltage to the QB_O node during the odd frame period. The high level supply voltage Vdd_E applies a high level voltage to the QB_E node during the even frame period.

When transistors NT5_O and NT5_E are turned-on, a low level supply voltage Vss applies a low level voltage to the QB_O and the QB_E nodes via transistors NT5_O and NT5_E. In other words, the QB_O and QB_E nodes are discharged, so that a low level voltage is maintained at the QB_O and QB_E nodes. The QB_O and QB_E nodes maintain the low level voltage, so that the discharge of the QB_O and QB_E nodes turns off the (3_O)th, the (3_E)th, the (7_O)th, and the (7_E)th transistors NT3_O, NT3_E, NT7_O, and NT7_E.

When the transistor NT1 is turned-on, a high level voltage from a high level supply voltage Vdd is supplied to a Q node, to thereby charge the Q node with a mid-level voltage Vm. The mid-level voltage Vm charged on the Q node turns-on transistors NT44_O, NT44_E, NT5a_O, NT5a_E, and NT6 on the Q node. The transistors NT44_O and NT44_E provide a discharge path to the turned-on transistors NT43_O and NT43_E through the A_O and the A_E nodes, so that the A_O and the A_E nodes remain at a low level. Also, transistors NT5a_O and NT5a_E additionally secure a discharge path for the turned-on transistors NT5_O and NT5_E through the QB_O and the QB_E nodes, so that the QB_O and the QB_E nodes remain at a low level.

When transistor NT6 is turned-on, because the first clock signal C1 remains low, an output signal from the low level voltage is supplied to an output Vg_i of a current stage. A high level voltage from an odd frame high level supply voltage Vdd_O turns-on transistors NT41_O and NT5b_E. When transistor NT41_O is turned-on, the high level voltage of the odd frame high level supply voltage Vdd_O is supplied to a A_O node and then the high level voltage is maintained at the A_O node. But, as described above, transistors NT43_O and NT44_O provide a discharge path to keep the A_O node at a low level voltage. The transistor NT41_O turned-on by the odd frame high level supply voltage Vdd_O remains continually on during the odd frame period. Transistor NT5b_E provides a discharge path for the QB_E node. Following the time period A, although the transistors NT5_O, NT5_E, NT5a_O, NT5a_E are turned-off, transistor NT5b_E is held continually on by the odd frame high level supply voltage Vdd_O during the odd frame period. Thus, the discharge path of the QB_E node remains active during the odd frame period.

During a time period B period, the first clock signal C1 is inverted from the low level voltage to the high level voltage, on the other hand, the start signal Vst is inverted from the high level voltage to the low level voltage. At this time, when the first transistor NT1 is turned-off, the discharge path of the Q node is intercepted. Thereby, while a voltage charged in a parasitic capacitance between the drain electrode and the gate electrode of the sixth transistor NT6 is added to a mid-level voltage Vm floated on the Q node, the voltage of the Q node jumps higher than a threshold voltage of the transistor NT6. In other words, a bootstrapping effect causes the voltage at the Q node to increase to a higher voltage than during the time period A. Accordingly, during the time period B, transistor NT6 is turned-on and an output signal Vg_i is increased by the first clock signal C1 applied through the turn-on transistor NT6, to thereby be inverted to a high level voltage. Further, the start signal Vst is inverted to the low level voltage to turn-off the transistors NT43_O, NT43_E, NT5_O and NT5_E, but transistors NT44_O, NT44_E, NT5a_O and NT5a_E, whose gate electrodes are connected to the Q node maintaining the high level voltage, remain low. Accordingly, the discharge path of the A_O, the A_E, the QB_O and the QB_E nodes is maintained, thereby keeping the low level voltage.

During a time period C, the first clock signal C1 is inverted from the high level voltage to the low level voltage, and the high level voltage of a next stage output signal Vg_i+1 is supplied to a gate terminal of transistor NT3a, which is then turned-on. When transistor NT3a is turned-on, the high level voltage at the Q node is discharged through transistor NT3a, so that the voltage on the Q node is inverted to the low level voltage. The low level voltage at the Q node turns-off transistors NT44_O, NT44_E, NT5a_O and NT5a_E, whose gate electrodes are connected to the Q node, to thereby intercept the discharge path of the A_O, the A_E, the QB_O and the QB_E nodes. Accordingly, the odd frame high level supply voltage Vdd_O supplies a high level voltage via the turned-on transistor NT41_O to the A_O node, and the high level voltage at the A_O node turns-on the transistor NT42_O to supply the high level voltage from the high level supply voltage Vdd_O to the QB_O node. The high level voltage supplied to the QB_O node turns-on transistors NT3_O and NT7_O, whose gate electrodes are connected to the QB_O node. An additional discharge path is formed through the turned-on transistor NT3a by turning on the transistor NT3_O, and the output signal Vg_i is inverted to a low level voltage by turning on transistor NT7_O.

During a time period D, the next stage output signal Vg_j+1 is inverted to the low level voltage, thereby turning-off transistor NT3a. As described above, the high level supply voltage Vdd_O holds the QB_O node continually high by supplying the odd frame high level voltage through transistors NT41_O and NT42_O during the remaining odd frame period. Accordingly, the voltage at the Q node and the output signal Vg_i remain at a low level during the remaining odd frame period. As described above, The QB_E node maintains the low level voltage provided by transistor NT5b_E, which is turned-on by the odd frame high level supply voltage Vdd_O. The operation during the even frame period will be described as follows.

During the time period A period, the first to the third clock signals C1 to C3 maintain a low level voltage, and the start signal Vst or a high level voltage from the previous stage output signal Vg_j−1 is supplied to a gate electrode of transistors NT1, NT43_O, NT43_E, NT5_O and NT5_E, thereby turning on the transistors NT1, NT43_O, NT43_E, NT5_O and NT5_E. When transistors NT43_O and NT43_E are turned-on, a low level voltage from a low potential supply voltage Vss is supplied to A_O and A_E nodes via the transistors NT43_O and NT43_E. In other words, the A_O and the A_E nodes are discharged, so that the low level voltage is maintained at the A_O and the A_E nodes. The low level voltage at the A_O and the A_E nodes turns-off transistor NT42_O and NT42_E. A high level supply voltage Vdd_O provides a high level voltage to the QB_O node during the odd frame period. The high level supply voltage Vdd_E provides a high level voltage to the QB_E node during the even frame period.

When transistors NT5_O and NT5_E are turned-on, the low level supply voltage Vss applies a low level voltage to the QB_O and the QB_E nodes via transistors NT5_O and NT5_E. In other words, the QB_O and the QB_E nodes are discharged, so that the low level voltage is maintained at the QB_O and the QB_E nodes. The QB_O and the QB_E nodes maintain the low level voltage. The discharge of the QB_O and the QB_E nodes turns off transistors NT3_O, NT3_E, NT7_O, and NT7_E to intercept the discharge path of the Q node. When the first transistor NT1 is turned-on, the high level supply voltage Vdd applies a high level voltage to a Q node, to thereby charge the Q node with a mid-level voltage Vm. The mid-level voltage Vm charged on the Q node turns on transistors NT44_O, NT44_E, NT5a_O, NT5a_E, and NT6 at the Q node. The transistors NT44_O and NT44_E provide a discharge path for the turned-on transistors NT43_O and NT43_E through the A_O and the A_E nodes, so that the A_O and the A_E nodes remain at the low level voltage. Also, transistors NT5a_O and NT5a_E provide a discharge path for the turned-on transistors NT5_O and NT5_E through the QB_O and the QB_E nodes, thereby the QB_O and the QB_E nodes remain at the low level voltage.

When transistor NT6 is turned on, because the first clock signal C1 is low, a current stage output signal Vg_i is supplied with the output signal of the low level voltage. A high level voltage from an even frame high level supply voltage Vdd_E turns-on transistors NT41_E and NT5b_O. When transistor NT41_E is turned-on, the even frame high level supply voltage Vdd_E applies a high level voltage to a A_E node. Then, the high level voltage is maintained at the A_E node. But, as described above, the discharge path is provided by transistors NT43_E and NT44_E, so that the A_E node maintains the low level voltage. The transistor NT41_E is turned on by the even frame high level supply voltage Vdd_E during the even frame period, and remains continually on. Transistor NT5b_O forms the discharge path through the QB_O node. After the time period A, although transistors NT5_O, NT5_E, NT5a_O, NT5a_E are turned-off, the (5b_O)th transistor NT5b_O is kept continually on by the even frame high level supply voltage Vdd_E during the even frame period, to thereby continually form the discharge path through the QB_O node during the even frame period.

During the time period B, the first clock signal C1 is inverted from the low level voltage to the high level voltage, on the other hand, the start signal Vst is inverted from the high level voltage to the low level voltage. Then, when transistor NT1 is turned-off, the discharge path of the Q node is intercepted. Thereby, while a voltage charged in a parasitic capacitance between the drain electrode and the gate electrode of transistor NT6 is added to a mid-level voltage Vm floated on the Q node, the voltage of the Q node increases higher than a threshold voltage of transistor NT6. In other words, a bootstrapping effect raises the voltage of the Q node to a higher voltage than that of the time period A. Accordingly, during the time period B, transistor NT6 is turned-on and an output signal Vg_i is increased by the voltage of the first clock signal C1 applied to transistor NT6, which is inverted to the high level voltage. Further, the start signal Vst is inverted to the low level voltage to turn-off transistors NT43_O, NT43_E, NT5_O and NT5_E, but transistors NT44_O, NT44_E, NT5a_O and NT5a_E, whose gate electrodes are connected to the Q node maintaining the high level voltage, remain on.

Accordingly, the discharge path of the A_O, the A_E, the QB_O and the QB_E nodes is maintained, thereby holding the low level voltage.

During the time period C, the first clock signal C1 is inverted from the high level voltage to the low level voltage, and the high level voltage of a next stage output signal Vg_i+1 is supplied to a gate terminal of transistor NT3a to turn-on transistor NT3a. When transistor NT3a is turned-on, the high level voltage on the Q node is discharged through transistor NT3a, so that the voltage on the Q node is inverted to the low level voltage. The low level voltage of the Q node turns-off transistors NT44_O, NT44_E, NT5a_O and NT5a_E, whose gate electrodes are connected to the Q node, to thereby intercept the discharge path of the A_O, the A_E, the QB_O and the QB_E nodes. Accordingly, the even frame high level supply voltage Vdd_E provides a high level voltage via the turned-on transistor NT41_E to the A_E node. The high level voltage at the A_E node turns-on transistor NT42_E to supply the high level voltage from the even frame high level supply voltage Vdd_E to the QB_E node. The high level voltage supplied to the QB_E node turns-on transistors NT3_E and NT7_E, whose gate electrodes are connected to the QB_E node. An additional discharge path is formed in the turned-on transistor NT3a by turning on transistor NT3_E, and the output signal Vg_i is inverted to the low level voltage by turning on the transistor NT7_E.

During the time period D, the next stage output signal Vg_i+1 is inverted to the low level voltage; to thereby turn-off transistor NT3a. As described above, the QB_E node continually maintains the high level voltage from the even frame high level supply voltage Vdd_E supplied through transistors NT41_E and NT42_E during the remaining even frame period. Accordingly, the voltage of the Q node and the output signal Vg_i remain low during the remaining even frame period. The QB_O node, as described above, maintains the low level voltage provided by transistor NT5b_O, which is turned-on by the even frame high level supply voltage Vdd_E. In embodiments of the present invention as depicted in FIG. 16, a time for applying the gate voltage of transistors NT4_O and NT4_E is long. In comparison, in embodiments of the present invention as depicted in FIG. 18, a time for applying the gate voltage of transistors NT42_O and NT42_E becomes short due to transistors NT41_O, NT43_O, NT44_O, NT41_E, NT43_E, and NT44_E. Accordingly, a gate stress of transistors NT42_O and NT42_E can be reduced in FIG. 18 in comparison to FIG. 16. Thus, deterioration of the transistor can be precented.

Figure 19:
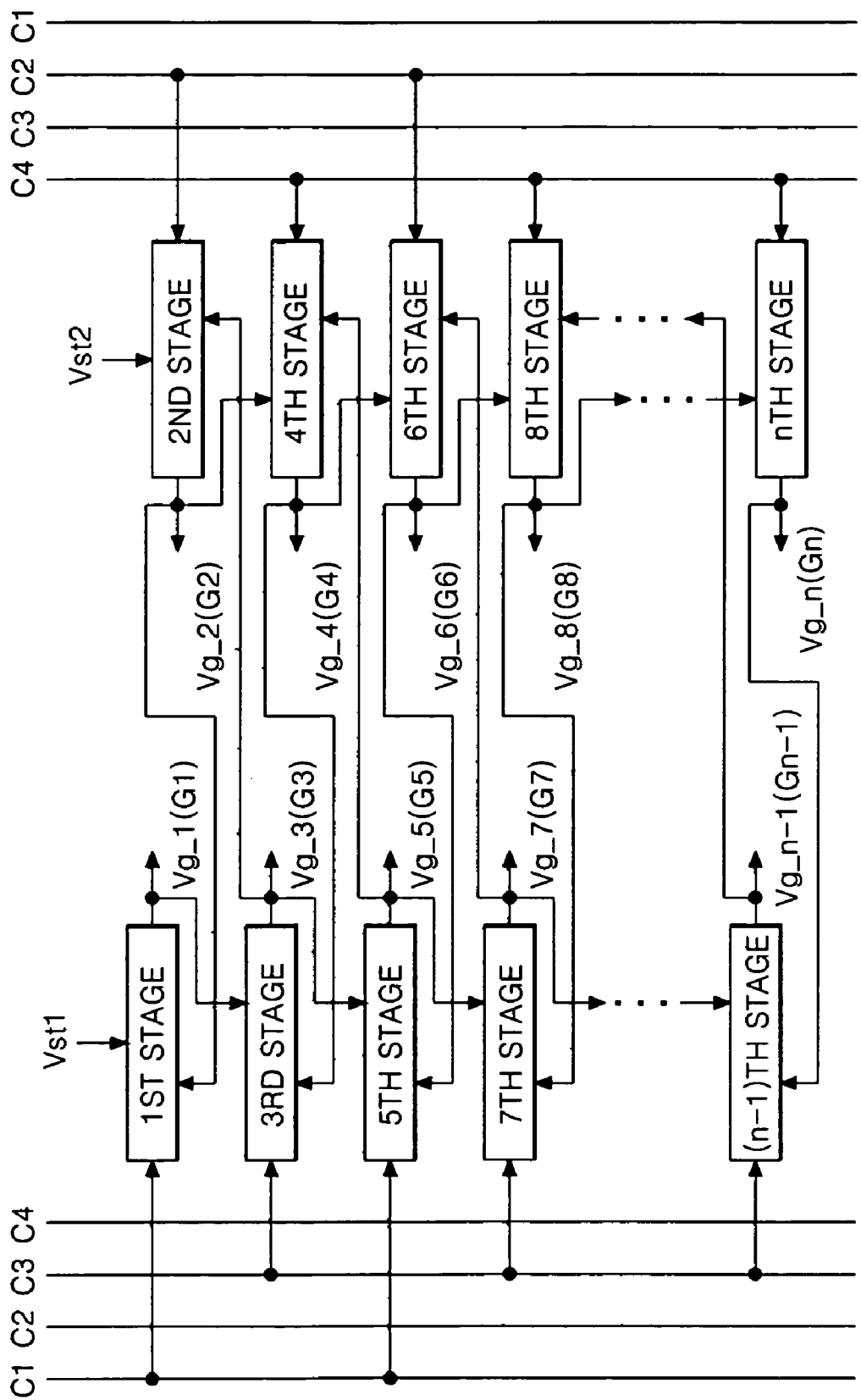
FIG. 19 is a schematic view for another exemplary method of driving odd and even gate driving circuits according to the fourth embodiment of the present invention.

FIG. 19 is a schematic view for an exemplary method of driving odd and even gate driving circuits according to the fourth embodiment of the present invention. Referring to FIG. 19, the odd driving circuit 140o includes 1st, 3rd, 5th, . . . , (n–1)-th odd stages. The even driving circuit 140e includes 2nd, 4th, 6th, . . . , n-th even stages. The first stage 1st receives as a start pulse the start signal Vst1. The second stage 2nd receives as a start pulse the start signal Vst2. The start signal Vst2 is delayed by one clock period with respect to the start signal Vst1. Each of the remaining i-numbered odd stages 3rd, 5th, . . . , (n–1)-th receives as a start pulse an output signal Vg_i–2 from the previous (i–2)-numbered odd stage. Similarly, each of the remaining i-numbered even stages 2nd, 4th, 6th, . . . , n-th receives as a start pulse an output signal Vg_i–2 from the previous (i–2)-numbered even stage. For example, the fourth stage 4th receives start signal Vg_2 from the second stage. The third stage 3rd receives the start signal Vg_1 from the first stage 1st. Furthermore, each of the even and odd stages responds to one of first to fourth clock signals C1, C2, C3 and C4. The one clock signal is supplied by delaying two clock periods to apply the output signal Vg_i synchronized to the clock signal to the gate line Gi via an output buffer and a level-shifter (not shown). Furthermore, each of the odd and even stages 1st, 2nd, 3rd, 4th, . . . , and (n–1) receives as a reset pulse an output signal Vg_i+1 delayed by one clock period from a next stage (i+1)-th. The last stage n-th is provided with a reset pulse obtained from a dummy stage (not shown) by delaying one clock signal. The above driving method can be implementing using the exemplary driving stages depicted in FIGS. 16 and 18.

Figure 20:
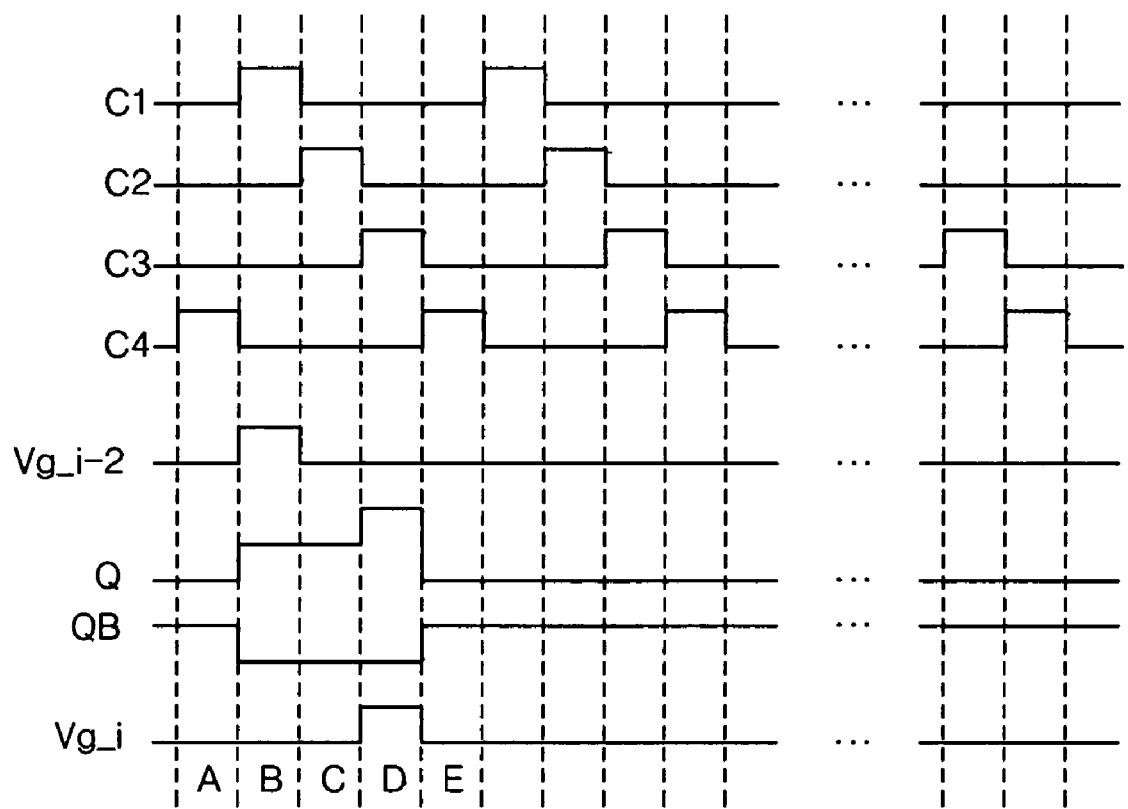
FIG. 20 shows exemplary waveforms applied to the built-in gate driving circuit of FIG. 19.

Firstly, the gate driving circuit of FIG. 19 includes a second start signal Vst2, supplied by delaying a first start signal Vst1 by one clock period. In comparison, the driving method of FIG. 15 includes one start signal Vst. Further, in the driving method of FIG. 15, the start signal Vst is inputted and the clock signal is supplied by delaying by one clock period. In comparison, in the driving method of FIG. 19, the start signal Vst is inputted and the clock signal is supplied after delaying by two clock periods, therefore, the period when the Q node maintains the floated mid-level voltage increases by one clock period as shown in FIG. 20.

As described above, according to embodiments of the present invention, the gate lines are divided into odd and even lines to make a bi-directional driving, thereby enlarging a length of one stage to correspond to two liquid crystal cells. Thus, a channel width of the output buffer can be increased. Accordingly, a distortion of the scanning pulse waveform at each stage of the driving circuit, which closely depends upon the channel width of the output buffer, can be reduced. Furthermore, the liquid crystal display panel will last longer because the life of the panel is directly dependent upon the channel width. In addition, in embodiments of the present invention, in the liquid crystal display panel with built-in driving circuit, a plurality of pull-down transistors is arranged in a space within the output buffer partitioned into odd/even driving stages, and the period for applying the gate voltage of the pull-down transistors is reduced. Accordingly, it is possible to reduce deterioration of the output buffer caused by the stress of the gate voltage. As a result, it is possible to extend the life span of the output buffer.

It will be apparent to those skilled in the art that various modifications and variations can be made in the liquid crystal display panel having built-in driving circuit of the present invention without departing from the spirit or scope of the invention. Thus, it is intended that the present invention cover the modifications and variations of this invention provided they come within the scope of the appended claims and their equivalents.

What is claimed is:

1. A liquid crystal display panel, comprising:

liquid crystal cells forming a matrix in a display area of the liquid crystal display panel;

odd and even gate driving circuits provided at an outer area of the display area, the display area being positioned between the odd and even gate driving circuits, the odd driving circuit including a plurality of odd stages, the even driving circuit including a plurality of even stages;

a plurality of gate lines, including even gate lines and odd gate lines in the liquid crystal cell matrix, the odd gate lines being driven by the odd driving circuit, and the even gate lines being driven by the even driving circuit, wherein a length of each of the odd stages and the even stages corresponds to size larger than a length of the liquid crystal cell;

wherein each of the odd and even stages includes: an output buffer for supplying a scanning pulse to a corresponding gate line; and a controller for controlling the output buffer;

wherein the controller of each of the odd and even stages is included in an area corresponding to a length of one liquid crystal cell, and the output buffer of each of the odd and even stages is included in an area corresponding to a length of two liquid crystal cells.

2. The liquid crystal display panel of claim 1, wherein a plurality of line-on-glass type signal lines is provided at an outer portion of each of the odd and even stages to supply a plurality of gate control signals and power signals.

3. The liquid crystal display panel of claim 1, wherein a start pulse of each of the odd stages includes an output signal from a previous one of the odd stages, and a start pulse of each of the even stages includes an output signal of a previous one of the even stages.

4. The liquid crystal display panel of claim 3, wherein each of the odd stages has an opened structure with respect to the even gate lines and each of the even stages has an opened structure with respect to the odd gate lines.

5. The liquid crystal display panel of claim 4, wherein different clock signals and start pulses are externally supplied to the odd and even stages.

6. The liquid crystal display panel of claim 3, wherein the output buffer of each of the odd and even stages includes:
a pull-up transistor for applying any one of a high-level voltage and a low-level voltage to the gate line in response to a clock signal; and
a pull-down transistor for applying a low-level voltage to the gate lines in response to the clock signal.

7. The liquid crystal display panel of claim 6, wherein the high-level voltage is applied to the gate line at a first time period preceding a second time period when the pull-up transistor of each of the odd and even stages is turned down.

8. The liquid crystal display panel of claim 7, wherein each of the odd and even stages includes:
a first transistor turned on by the start pulse to turn on the pull-up transistor, thereby applying a high-level voltage from a first clock signal to the gate line;
a second transistor turned on by a high-level voltage from a second clock signal, thereby applying a high-level voltage to the pull-down transistor;
a third transistor supplied with the high-level voltage to discharge an electric charge charged between the first transistor and the pull-up transistor and being connected to the pull-down transistor on a current mirror basis;
a fourth transistor receiving a high-level voltage from a next stage to discharge an electric charge charged between the first transistor and the pull-up transistor; and
fifth and sixth transistors being connected, in parallel, between a drain terminal of the second transistor and a ground.

9. The liquid crystal display panel according to claim 6, wherein an even start pulse and an even clock signal applied to the even stage are delayed by one time period with respect to an odd start pulse and an odd clock signal applied to the odd stage, respectively.

10. The liquid crystal display panel of claim 1, wherein the high-level voltage is applied to the gate line after the pull-up transistor was turned on during more than two consecutive time periods.

11. The liquid crystal display panel of claim 10, wherein the pull-up transistor is turned on during three consecutive time periods.

12. The liquid crystal display panel of claim 1, wherein a start pulse of each of the odd stages includes an output signal from a previous one of the even stages, and a start pulse of each of the even stages includes an output signal of a previous one of the odd stages.

13. The liquid crystal display panel of claim 12, wherein each of the odd stages receives an output signal from a previous one of the even stages via an even gate line, and each of the even stages receives an output signal from a previous one of the odd stages via an odd gate line.

14. The liquid crystal display panel of claim 13, wherein the same start pulse and the same clock signals are externally applied to the odd and even stages.

15. The liquid crystal display panel according to claim 1, wherein the output buffer includes:
a pull-up transistor controlled by a Q node;
a first pull-down transistor controlled by a QB_O node; and
a second pull-down transistor controlled by a QB_E node.

16. The liquid crystal display panel according to claim 15, wherein the first and the second pull-down transistors operate alternatively for a frame period.

17. The liquid crystal display panel according to claim 15, wherein the controller includes:
a first controller for performing one of charging and discharging the Q node;
a second controller for performing one of charging and discharging the QB_O node; and
a third controller for performing one of charging and discharging the QB_E node.

18. The liquid crystal display panel according to claim 17, wherein the first controller includes:
a first transistor having a drain terminal in which a high level supply voltage is supplied, a gate terminal in which any one of a start pulse and a previous stage output signal is supplied via a first node, and a source terminal connected to the Q node;
a second transistor having a drain terminal connected to the Q node, a source terminal in which a low potential supply voltage is supplied via a second node, and a gate terminal in which a next stage output signal is supplied; and
a third transistor having a drain terminal in which a clock signal is supplied, a source terminal connected to the output terminal, and a gate terminal connected to the Q node.

19. The liquid crystal display panel according to claim 18, wherein the second controller includes:
a fourth transistor having a drain terminal connected to the Q node, a source terminal connected to the second node, and a gate terminal connected to the QB_O node;
a fifth transistor having a drain terminal connected to the output terminal, a source terminal connected to the second node, and a gate terminal connected to the QB_O node;
a sixth transistor having a drain terminal and a gate terminal in which an odd high level supply voltage, generated during an odd frame, is supplied via a third node, and a source terminal connected to a fourth node;
a seventh transistor having a drain terminal connected to the third node, a gate terminal connected to the fourth node, and a source terminal connected to the QB_O node;
an eighth transistor having a drain terminal connected to the fourth node, a gate terminal connected to the first node, and a source terminal connected to the second node;

a ninth transistor having a drain terminal connected to the fourth node, a gate terminal connected to the Q node, and a source terminal connected to the second node;

a tenth transistor having a drain terminal connected to the QB_O node, a source terminal connected to the second node, and a gate terminal connected to the first node;

an eleventh transistor having a drain terminal connected to the QB_O node, a source terminal connected to the second node, and a gate terminal connected to the Q node; and a twelfth transistor having a drain terminal connected to the QB_O node, a source terminal connected to the second node, and a gate terminal connected to a fifth node.

20. The liquid crystal display panel according to claim 19, wherein the third controller includes:

a thirteenth transistor having a drain terminal connected to the Q node, a source terminal connected to the second node, and a gate terminal connected to the QB_E node;

a fourteenth transistor having a drain terminal connected to the output terminal, a source terminal connected to the second node, and a gate terminal connected to the QB_E node;

a fifteenth transistor having a drain terminal and a gate terminal in which an even high level supply voltage, generated during an even frame, is supplied via the fifth node, and a source terminal connected to a sixth node;

a sixteenth transistor having a drain terminal connected to the fifth node, a gate terminal connected to the sixth node, and a source terminal connected to the QB_E node;

a seventeenth transistor having a drain terminal connected to the sixth node, a gate terminal connected to the first node, and a source terminal connected to the second node;

an eighteenth transistor having a drain terminal connected to the sixth node, a gate terminal connected to the Q node, and a source terminal connected to the second node;

a nineteenth transistor having a drain terminal connected to the QB_E node, a source terminal connected to the second node, and a gate terminal connected to the first node;

a twentieth transistor having a drain terminal connected to the QB_E node, a source terminal connected to the second node, and a gate terminal connected to the Q node; and a twenty first transistor having a drain terminal connected to the QB_E node, a source terminal connected to the second node, and a gate terminal connected to the third node.

21. The liquid crystal display panel according to claim 20, wherein the clock signal is generated after the Q node is firstly charged by the high level supply voltage.

22. The liquid crystal display panel according to claim 18, wherein the second controller includes:

a twenty second transistor having a drain terminal connected to the Q node, a source terminal connected to the second node, and a gate terminal connected to the QB_O node;

a twenty third transistor having a drain terminal connected to the output terminal, a source terminal connected to the second node, and a gate terminal connected to the QB_O node;

a twenty fourth transistor having a drain terminal and a gate terminal in which an odd high level supply voltage, generated during an odd frame, is supplied via a third node, and a source terminal connected to the QB_O node;

a twenty fifth transistor having a drain terminal connected to the QB_O node, a source terminal connected to the second node, and a gate terminal connected to the first node;

a twenty sixth transistor having a drain terminal connected to the QB_O node, a source terminal connected to the second node, and a gate terminal connected to the Q node; and a twenty seventh transistor having a drain terminal connected to the QB_O node, a source terminal connected to the second node, and a gate terminal connected to a fourth node.

23. The liquid crystal display panel according to claim 22, wherein the third controller includes:

a twenty eighth transistor having a drain terminal connected to the Q node, a source terminal connected to the second node, and a gate terminal connected to the QB_E node;

a twenty ninth transistor having a drain terminal connected to the output terminal, a source terminal connected to the second node, and a gate terminal connected to the QB_E node;

a thirtieth transistor having a drain terminal and a gate terminal in which an even high level supply voltage, generated during an even frame, is supplied via the fourth node, and a source terminal connected to the QB_E node;

a thirty first transistor having a drain terminal connected to the QB_E node a source terminal connected to the second node, and a gate terminal connected to the first node;

a thirty second transistor having a drain terminal connected to the QB_E node, a source terminal connected to the second node, and a gate terminal connected to the Q node; and a thirty third transistor having a drain terminal connected to the QB_E node, a source terminal connected to the second node, and a gate terminal connected to the third node.

24. The liquid crystal display panel according to claim 23, wherein the clock signal is generated after the Q node is firstly charged by the high level supply voltage.

* * * * *